(12) United States Patent
Kurimoto

(10) Patent No.: US 7,801,503 B2
(45) Date of Patent: Sep. 21, 2010

(54) DIRECT CONVERSION RECEIVER CIRCUIT

(75) Inventor: Hidehiko Kurimoto, Takarazuka (JP)

(73) Assignee: Panasonic Corporation, Osaka (JP)

( * ) Notice: Subject to any disclaimer, the term of this patent is extended or adjusted under 35 U.S.C. 154(b) by 1192 days.

(21) Appl. No.: 11/400,936

(22) Filed: Apr. 10, 2006

(65) Prior Publication Data

US 2006/0229043 A1 Oct. 12, 2006

(30) Foreign Application Priority Data

Apr. 12, 2005 (JP) ............................. 2005-114929

(51) Int. Cl.
*H04B 1/06* (2006.01)

(52) U.S. Cl. .................... 455/234.1; 455/323; 455/334; 375/345

(58) Field of Classification Search ................. 455/230, 455/232.1, 234.1, 240.1, 323, 334, 338, 339, 455/341; 375/345
See application file for complete search history.

(56) References Cited

U.S. PATENT DOCUMENTS

| | | | |
|---|---|---|---|
| 7,092,513 B1 * | 8/2006 | Lashley et al. | 379/388.03 |
| 2002/0047744 A1 | 4/2002 | Ichihara | |
| 2003/0142767 A1 | 7/2003 | Ichihara | |
| 2004/0097212 A1 * | 5/2004 | Matsumoto et al. | 455/296 |
| 2005/0130615 A1 * | 6/2005 | Darabi | 455/232.1 |
| 2005/0286660 A1 * | 12/2005 | Nysen et al. | 375/343 |
| 2006/0141972 A1 | 6/2006 | Matsuno | |

FOREIGN PATENT DOCUMENTS

| | | |
|---|---|---|
| JP | 55-171109 | 12/1980 |
| JP | 2002-94344 A | 3/2002 |
| JP | 2003-224488 A | 8/2003 |
| JP | 2003-224489 | 8/2003 |
| JP | 2005-12409 A | 1/2005 |
| JP | 2005-86267 A | 3/2005 |
| WO | WO 2004/075426 | 9/2004 |

OTHER PUBLICATIONS

Japanese Office Action, dated Aug. 14, 2008.

* cited by examiner

*Primary Examiner*—Nhan Le
(74) *Attorney, Agent, or Firm*—Hamre, Schumann, Mueller & Larson, P.C.

(57) ABSTRACT

A receiver circuit includes a low noise amplifier (LNA) 1 to which a received signal is input, a mixer 2 for mixing an output of the LNA and a local signal, a first low-pass filter 3 for receiving an output of the mixer, and a composite amplifier in which a fixed gain amplifier 4, a high-pass filter 5, and a gain control amplifier 6 are connected in this order from the input side. An output of the first low-pass filter is input to the fixed gain amplifier. The gain of the fixed gain amplifier is 0 dB or more. The maximum gain of the gain control amplifier is 0 dB or less. The receiver circuit can suppress a transient response due to DC voltage fluctuations, even if the gains are changed while signals are received in a communication mode that performs continuous reception.

14 Claims, 22 Drawing Sheets

DIRECT CONVERSION RECEIVER CIRCUIT

FIELD OF THE INVENTION

The present invention relates to a direct conversion receiver circuit.

BACKGROUND OF THE INVENTION

There has been a growing demand for small low-cost radio communication equipment. To meet this demand, a direct conversion receiver circuit is advantageous because the high-frequency circuit portion is simple, and the number of components can be decreased. However, the direct conversion receiver circuit also has some disadvantages, and one of the major disadvantages is a DC offset voltage.

The DC offset voltage is amplified as the gain of a baseband circuit is increased. Therefore, when the gain of the baseband circuit is the maximum (e.g., 60 dB), the DC offset voltage becomes larger than the power supply voltage of the baseband circuit. Consequently, no signal is transmitted to the output of the baseband circuit.

The DC offset voltage in a conventional direct conversion receiver circuit has been addressed, e.g., by JP 2003-224489 A. FIG. 20 shows a circuit as disclosed in JP 2003-224489 A. The circuit of FIG. 20 is a baseband circuit of a direct conversion receiver.

In FIG. 20, reference numeral 201 denotes a low-pass filter, 202, 204, and 206 denote gain control amplifiers, and 203, 205, and 207 denote high-pass filters. A gain distribution circuit 208 controls the gains of the gain control amplifiers 202, 204, and 206. A control circuit 209 controls changes in the low cutoff frequencies of the high-pass filters 203, 205, and 207. A node 2a is the input of the baseband circuit, and a node 2b is the output of the baseband circuit. A node 2c is the input of the gain control amplifier 206, and a node 2d is the output of the gain control amplifier 206. A node 2e is for inputting a gain control signal. A control signal line 2f is for controlling the gain of the gain control amplifier 206. A control line 2g is for controlling the low cutoff frequencies of the high-pass filters 203, 205, and 207.

In this configuration, the DC offset voltage output from each of the gain control amplifiers 202, 204, and 206 is amplified with increasing the gains of the gain control amplifiers. However, due to the presence of the high-pass filters 203, 205, and 207, the DC offset voltage is not transmitted to the outputs of the high-pass filters, so that a DC offset does not occur in the node 2b, which is the final output.

According to the configuration of FIG. 20, a signal can be transmitted to the node 2b (final output) even at the maximum gain of the baseband circuit.

On the other hand, in the case of a direct conversion system, the input signal of the baseband circuit is a baseband signal and also includes a DC as a frequency component. Therefore, the low cutoff frequencies of the high-pass filters 203, 205, and 207 should be as small as possible. However, if the low cutoff frequencies of the high-pass filters 203, 205, and 207 are sufficiently small, a transient response occurs in the outputs of the high-pass filters 203, 205, and 207 when the DC offset voltage output from each of the gain control amplifiers 202, 204, and 206 is changed by switching the gains. The convergence time of the transient response is determined by the time constants of the high-pass filters and thus becomes longer.

When the gains are increased significantly, the transient response in the output of the high-pass filter 205 is amplified by, e.g., the gain control amplifier 206. Therefore, a large transient response occurs in the output of the baseband circuit for a long time.

The circuit of FIG. 20 has a configuration to solve the problem of this transient response. That is, the low cutoff frequencies of the high-pass filters 203, 205, and 207 are varied with changes in the gains of the gain control amplifiers 202, 204, and 206. Specifically, when the amount of change in gain is small enough (e.g., less than 6 dB), the low cutoff frequencies are made as small as possible. When the amount of change in gain is more than a predetermined value (e.g., not less than 6 dB), the low cutoff frequencies are made higher. Thus, even if the gains are increased significantly, the transient response caused by a DC offset can converge quickly.

The above function of the conventional circuit may be useful in the absence of a baseband signal. However, when the gains are increased significantly while the baseband signal is input to the circuit, a transient response occurs due to DC offset voltage fluctuations resulting from the presence of the baseband signal. In addition, the convergence time is longer because it is determined by the time constants of the high-pass filters 203, 205, and 207.

FIG. 21 shows a transient response that occurs when the low cutoff frequencies of the high-pass filters 203, 205, and 207 are varied, e.g., with a significant increase in the gain of the gain control amplifier 206 while the baseband signal is input to the circuit of FIG. 20.

In FIG. 21, (a) indicates a waveform at the control signal line 2f for controlling the gain of the gain control amplifier 206, (b) indicates a waveform at the control line 2g for controlling the low cutoff frequencies of the high-pass filters 203, 205, and 207, (c) indicates a waveform at the node 2c as the input of the gain control amplifier 206, (d) indicates a waveform at the node 2d as the output of the gain control amplifier 206, and (e) indicates a waveform at the node 2b as the final output of the circuit.

The operation of the circuit of FIG. 20 will be described by referring to FIG. 21. As shown in FIGS. 21(a) and (b), the gain of the gain control amplifier 206 and the low cutoff frequencies of the high-pass filters 203, 205, and 207 are switched at time t1. In FIG. 21(b), the low cutoff frequencies of the high-pass filters are changed from high to low at time t2.

Under this control, there is no change in either the signal amplitude or DC voltage in the input node 2c of the gain control amplifier 206, as shown in FIG. 21(c). In the output node 2d, however, the signal amplitude is increased and the DC offset voltage is changed at t1, as shown in FIG. 21(d). After t1, the signal amplitude and the DC offset voltage are unchanged.

Next, the waveform at the node 2b (final output) of the circuit of FIG. 20 will be described by referring to FIG. 21(e). At t1, the gain of the gain control amplifier 206 is increased, and the low cutoff frequency of the high-pass filter 207 is changed from low to high. Then, the low cutoff frequency of the high-pass filter 207 is changed from high to low at t2. Therefore, a signal is interrupted between t1 and t2, and only a DC is output to the node 2b. At t2, the high-pass filter 207 transmits a signal because the low cutoff frequency is changed from high to low, and the signal is output to the node 2b.

Depending on the phase of the input signal of the high-pass filter 207, i.e., the phase of the signal of the node 2d, DC offset fluctuations whose maximum is half the magnitude of the signal amplitude may occur in the node 2d at t2. The DC offset fluctuations reach the maximum when the input signal of the high-pass filter 207 (the signal of the node 2d) is at its bottom or peak at t2. FIG. 21(e) shows a transient response when the signal of the node 2d is at the bottom.

In a communication mode that performs continuous reception such as W-CDMA, it is necessary to change the gains while signals are being received. Therefore, when the conventional circuit is used for this communication mode, the gains have to be switched during the reception of signals, so that a transient response occurs due to DC voltage fluctuations.

SUMMARY OF THE INVENTION

Therefore, with the foregoing in mind, it is an object of the present invention to provide a receiver circuit that can suppress a transient response due to DC voltage fluctuations, even if the gains are changed while signals are received in the communication mode that performs continuous reception such as W-CDMA.

A receiver circuit with a first configuration of the present invention includes the following: a low noise amplifier (LNA) to which a received signal is input; a mixer for mixing an output of the LNA and a local signal; a first low-pass filter for receiving an output of the mixer; and a composite amplifier in which a fixed gain amplifier, a high-pass filter, and a gain control amplifier are connected in the indicated order from the input side. The fixed gain amplifier receives an output of the first low-pass filter. The gain of the fixed gain amplifier is 0 dB or more. The maximum gain of the gain control amplifier is 0 dB or less.

This configuration can suppress a transient response due to DC voltage fluctuations, even if the gains are changed significantly during the reception of signals.

As a second configuration, the receiver circuit with the first configuration further may include the following: at least one stage of a composite amplifier arranged in the subsequent stage of the composite amplifier; an interstage high-pass filter connected between the composite amplifiers; an output high-pass filter connected to the output of the gain control amplifier of the composite amplifier in the last stage; first switches inserted between the output of the output high-pass filter and the output terminals of the receiver circuit; second switches inserted between the output side of the first switches and ground potentials; and a control circuit for controlling the first switches, the second switches, and the gains of all the gain control amplifiers. The control circuit has the following functions. When a gain-change pulse is input, the control circuit opens the first switches and closes the second switches, and then switches the gains of all the gain control amplifiers. After a predetermined time has passed from the switching of the gains, the control circuit closes the first switches and opens the second switches.

This configuration can increase the gain variable range of the circuit and suppress a transient response due to DC voltage fluctuations resulting from the presence of a signal in the final output, even if the gains are changed significantly during the reception of signals.

A receiver circuit with a third configuration is a modified embodiment in which the fixed gain amplifiers are removed from the second configuration. The receiver circuit with the third configuration includes the following: a LNA to which a received signal is input; a mixer for mixing an output of the LNA and a local signal; a-first low-pass filter for receiving an output of the mixer; multistage second composite amplifiers arranged in the subsequent stage of the first low-pass filter, each of the second composite amplifiers including a high-pass filter and a gain control amplifier that are connected in the indicated order; an output high-pass filter connected to the output of the gain control amplifier of the second composite amplifier in the last stage; first switches inserted between the output of the output high-pass filter and the output terminals of the receiver circuit; second switches inserted between the output side of the first switches and ground potentials; and a control circuit for controlling the first switches, the second switches, and the gains of all the gain control amplifiers. The gains of the gain control amplifiers are 0 dB or more. The control circuit has the following functions. When a gain-change pulse is input, the control circuit opens the first switches and closes the second switches, and then switches the gains of all the gain control amplifiers. After a predetermined time has passed from the switching of the gains, the control circuit closes the first switches and opens the second switches.

This configuration can increase the gain variable range of the circuit, reduce the circuit size, and suppress a transient response due to DC voltage fluctuations resulting from the presence of a signal in the final output, even if the gains are changed significantly during the reception of signals.

As a fourth configuration, the receiver circuit with the first configuration further may include the following: at least one stage of a composite amplifier arranged in the subsequent stage of the composite amplifier; an input high-pass filter inserted between the first low-pass filter and the first fixed gain amplifier of the composite amplifier in the first stage; a high-pass filter provided with switches that is inserted on the output side of the gain control amplifier of the composite amplifier in each stage, the high-pass filter including first resistors, first capacitors, and third switches connected parallel to the first resistors; a dummy amplifier that is connected to the output side of the first fixed gain amplifier, has the same configuration as the first fixed gain amplifier, and receives a voltage equal to the input DC voltage of the first fixed gain amplifier; and a control circuit for controlling the first fixed gain amplifier, the dummy amplifier, the third switches, and the gains of all the gain control amplifiers. The control circuit has the following functions. When a gain-change pulse is input, the control circuit puts the first fixed gain amplifier into a sleep state and the dummy amplifier into an active state, closes the third switches, and then switches the gains of all the gain control amplifiers. After a predetermined time has passed from the switching of the gains, the control circuit opens the third switches, and subsequently puts the first fixed gain amplifier into the active state and the dummy amplifier into the sleep state.

This configuration can increase the gain variable range of the circuit and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switched.

A receiver circuit with a fifth configuration is a modified embodiment in which the fixed gain amplifiers are removed from the fourth configuration. The receiver circuit with the fifth configuration includes the following: a LNA to which a received signal is input; a mixer for mixing an output of the LNA and a local signal; a first low-pass filter for receiving an output of the mixer; a first high-pass filter for receiving an output of the first low-pass filter; a fixed gain amplifier for receiving an output of the first high-pass filter; a second high-pass filter for receiving an output of the fixed gain amplifier; a dummy amplifier that is connected to the output side of the fixed gain amplifier, has the same configuration as the fixed gain amplifier, and receives a voltage equal to the input DC voltage of the fixed gain amplifier; multistage gain control amplifiers arranged in the subsequent stage of the second high-pass filter; a high-pass filter provided with switches that is inserted on the output side of the gain control amplifier in each stage, the high-pass filter including first resistors, first capacitors, and third switches connected parallel to the first resistors; and a control circuit for controlling the fixed gain amplifier, the dummy amplifier, the third switches, and the gains of all the gain control amplifiers. The gains of the gain control amplifiers are 0 dB or more. The control circuit has the following functions. When a gain-change pulse is input, the control circuit puts the fixed gain amplifier into a sleep state and the dummy amplifier into an active state, closes the third switches, and then switches the gains of all the gain control amplifiers. After a predetermined time has passed from the switching of the gains, the control circuit opens the third switches, and subsequently puts the fixed gain amplifier into the active state and the dummy amplifier into the sleep state.

This configuration can increase the gain variable range of the circuit, reduce the circuit size, and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switched.

As a sixth configuration, the receiver circuit with the first configuration further may include the following: at least one stage of a composite amplifier arranged in the subsequent stage of the composite amplifier; a high-pass filter provided with switches that is inserted on the output side of the gain control amplifier of the composite amplifier in each stage, the high-pass filter including first resistors, first capacitors, and third switches connected parallel to the first resistors; fourth switches inserted on the output side of the fixed gain amplifier of the composite amplifier in the first stage; and a control circuit for controlling the fourth switches, the third switches, and the gains of all the gain control amplifiers. The control circuit has the following functions. When a gain-change pulse is input, the control circuit opens the fourth switches, closes the third switches, and then switches the gains of all the gain control amplifiers. After a predetermined time has passed from the switching of the gains, the control circuit opens the third switches, and subsequently closes the fourth switched.

This configuration can increase the gain variable range of the circuit, reduce the circuit size, and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switches.

A receiver circuit with a seventh configuration is a modified embodiment in which the fixed gain amplifiers are removed from the sixth configuration. The receiver circuit with the seventh configuration includes the following: a LNA to which a received signal is input; a mixer for mixing an output of the LNA and a local signal; a first low-pass filter for receiving an output of the mixer; a high-pass filter for receiving an output of the first low-pass filter; multistage gain control amplifiers arranged in the subsequent stage of the high-pass filter; a high-pass filter provided with switches that is inserted on the output side of the gain control amplifier in each stage, the high-pass filter including first resistors, first capacitors, and third switches connected parallel to the first resistors; fourth switches inserted between the first low-pass filter and the high-pass filter; and a control circuit for controlling the fourth switches, the third switches, and the gains of all the gain control amplifiers. The gains of the gain control amplifiers are 0 dB or more. The control circuit has the following functions. When a gain-change pulse is input, the control circuit opens the fourth switches, closes the third switches, and then switches the gains of all the gain control amplifiers. After a predetermined time has passed from the switching of the gains, the control circuit opens the third switches, and subsequently closes the fourth switches.

This configuration can increase the gain variable range of the circuit, reduce the circuit size, and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switched.

As an eighth configuration, the receiver circuit with the first configuration further may include the following: at least one stage of a composite amplifier arranged in the subsequent stage of the composite amplifier; a composite high-pass filter inserted on the output side of the gain control amplifier of the composite amplifier in each stage; and a control circuit for controlling the composite high-pass filters and the gains of the gain control amplifiers. Each of the composite high-pass filters includes the following: second capacitors inserted on the output side of the gain control amplifier; second resistors connected between output terminals of the second capacitors and ground potentials; second low-pass filters, fifth switches, third capacitors, and sixth switches connected in series between input terminals of the second capacitors and the terminals of the second resistors that are located on the same side as the ground potentials; seventh switches inserted between the input terminals of the third capacitors and input terminals of the second capacitors; and eighth switches inserted between the output terminals of the third capacitors and output terminals of the second capacitors. The control circuit has the following functions. When a gain-change pulse is input, the control circuit closes the fifth switches and the sixth switches and opens the seventh switches and the eighth switches, and then switches the gains of the gain control amplifiers. After a predetermined time has passed from the switching of the gains, the control circuit opens the fifth switches and the sixth switches and closes the seventh switches and the eighth switches.

This configuration can increase the gain variable range of the circuit and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switched.

A receiver circuit with a ninth configuration is a modified embodiment in which the fixed gain amplifiers are removed from the eighth configuration. The receiver circuit with the ninth configuration includes the following: a LNA to which a received signal is input; a mixer for mixing an output of the LNA and a local signal; a first low-pass filter for receiving an output of the mixer; a high-pass filter for receiving an output of the first low-pass filter; multistage gain control amplifiers arranged in the subsequent stage of the high-pass filter; a composite high-pass filter inserted on the output side of the gain control amplifier in each stage; and a control circuit for controlling the composite high-pass filters and the gains of the gain control amplifiers. Each of the composite high-pass filters includes the following: second capacitors inserted on the output side of the gain control amplifier; second resistors connected between output terminals of the second capacitors and ground potentials; second low-pass filters, fifth switches, third capacitors, and sixth switches connected in series between input terminals of the second capacitors and the terminals of the second resistors that are located on the same side as the ground potentials; seventh switches inserted between the input terminals of the third capacitors and input terminals of the second capacitors; and eighth switches inserted between the output terminals of the third capacitors and output terminals of the second capacitors. The gains of the gain control amplifiers are 0 dB or more. The control circuit has the following functions. When a gain-change pulse is input, the control circuit closes the fifth switches and the sixth switches and opens the seventh switches and the eighth switches, and then switches the gains of the gain control amplifiers. After a predetermined time has passed from the switching of the gains, the control circuit opens the fifth switches and the sixth switches and closes the seventh switches and the eighth switches.

This configuration can increase the gain variable range of the circuit, reduce the circuit size, and suppress a transient response due to DC voltage fluctuations resulting from the presence of a signal, even if the gains are changed significantly during the reception of signals. Moreover, it is also possible to reduce the time of signal loss that occurs when the low cutoff frequencies of the high-pass filters are switched.

A portable telephone of the present invention includes an antenna, an antenna duplexer including a stationary terminal portion and switching terminals, a band-pass filter, the receiver circuit with any one of the above configurations, and a transmitting circuit. The antenna is connected to the stationary terminal portion of the antenna duplexer. The input side of the band-pass filter is connected to one of the switching terminals of the antenna duplexer. The input side of the receiver circuit is connected to the output side of the band-pass filter. The output side of the transmitting circuit is connected to the other switching terminal of the antenna duplexer.

This configuration can provide a superior portable telephone that can suppress a transient response due to DC voltage fluctuations, even if the gains are changed significantly while signals are received in the communication mode that performs continuous reception, and also can avoid degradation of the reception quality under the continuous reception.

DETAILED DESCRIPTION OF THE INVENTION

Hereinafter, the present invention will be described by way of illustrative embodiments with reference to the drawings.

Embodiment 1

A direct conversion receiver circuit of Embodiment 1 of the present invention will be described by referring to FIGS. 1 to 3 and 22.

Figure 1:
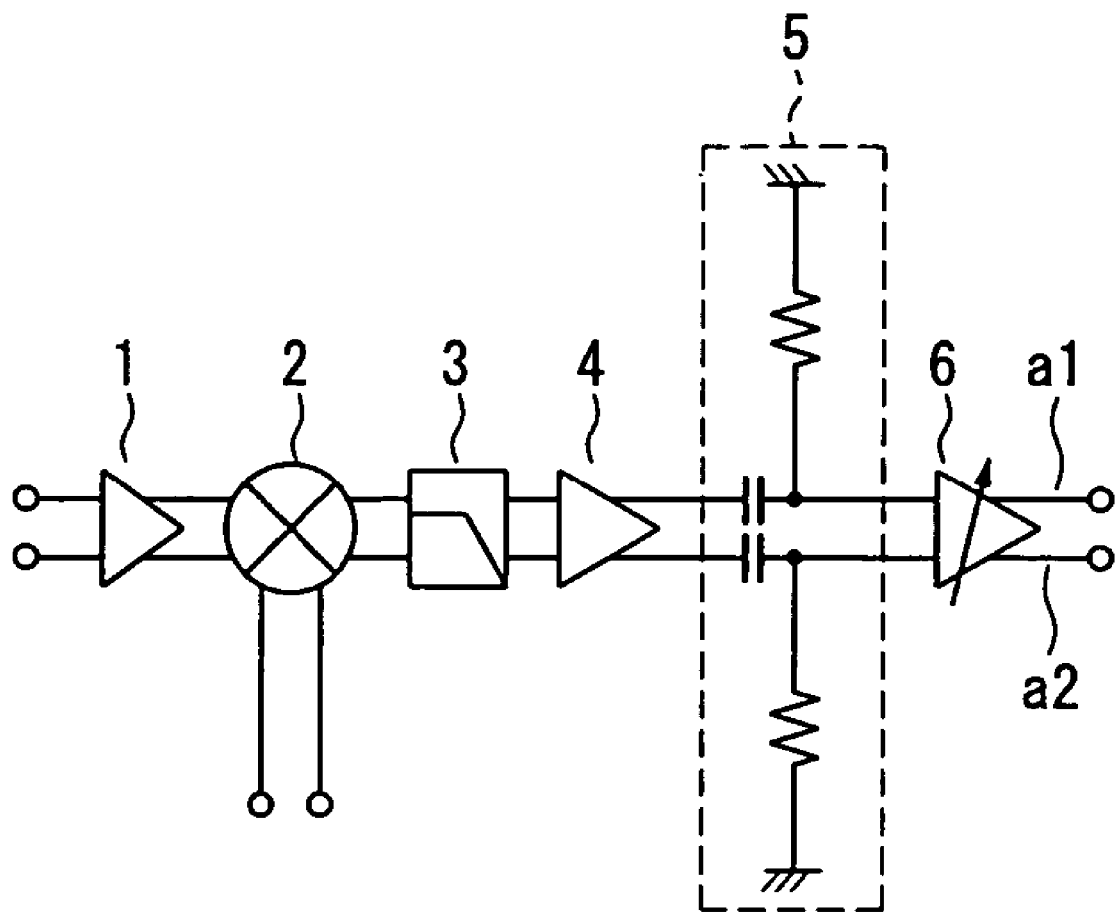
FIG. 1 is a circuit diagram showing the configuration of a radio communication receiver-circuit in Embodiment 1 of the present invention.

FIG. 1 shows a baseband circuit that constitutes the receiver circuit of this embodiment. The baseband circuit includes a low noise amplifier (referred to as "LNA" in the following) 1, a mixer 2, a low-pass filter 3, a fixed gain amplifier 4, a high-pass filter 5, and a gain control amplifier 6. An output of the fixed gain amplifier 4 is input to the high-pass filter 5, and an output of the high-pass filter 5 is input to the gain control amplifier 6. The gain of the fixed gain amplifier 4 is 0 dB or more. The maximum gain of the gain control amplifier 6 is 0 dB or less.

Figure 22:
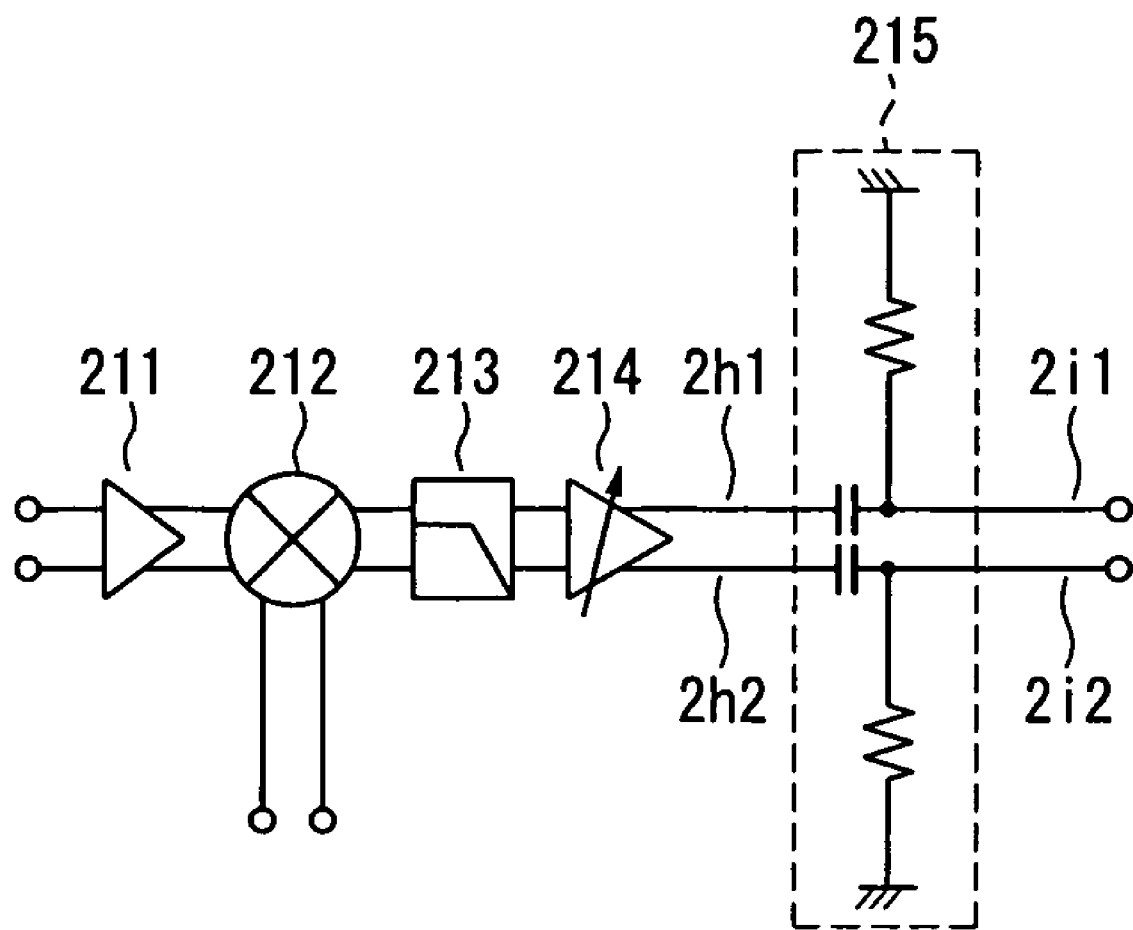
FIG. 22 is a circuit diagram showing the configuration of another conventional radio communication receiver circuit.

The operation of this circuit using the fixed gain amplifier 4 (with a gain of 0 dB or more) and the gain control amplifier 6 (with a maximum gain of 0 dB or less) will be described by comparison with a conventional circuit using a gain control amplifier 214, as shown in FIG. 22. The circuit of FIG. 22 includes a LNA 211, a mixer 212, a low-pass filter 213, the gain control amplifier 214, and a high-pass filter 215. The output of the gain control amplifier 214 is connected to the input of the high-pass filter 215. This circuit generally corresponds to the circuit of FIG. 1.

A transient response is compared between the circuit of FIG. 1 and the circuit of FIG. 22 by varying their gains in the same range.

In the circuit of FIG. 1, the gain of each of the LNA 1, the mixer 2, the low-pass filter 3, and the high-pass filter 5 is 0 dB, the gain of the fixed gain amplifier 4 is A dB, and the gain variable range of the gain control amplifier 6 is −A dB to 0 dB. In the circuit of FIG. 22, the gain of each of the LNA 211, the mixer 212, the low-pass filter 213, and the high-pass filter 215 is 0 dB, and the gain variable range of the gain control amplifier 214 is 0 dB to A dB. Therefore, the circuits of both FIGS. 1 and 22 have a gain variable range of 0 dB to A dB as a whole circuit.

Here, the gain control amplifiers 6, 214 are the same in the type of circuit, but differ from each other only in the gain variable range.

With the above configurations, the amount of change in the DC offset voltage output from the gain control amplifiers 6, 214 and a transient response in the final outputs as a result of changing the gains from 0 dB to A dB in the circuits of FIGS. 1 and 22 will be described below.

When the gains of the circuits in FIGS. 1 and 22 are changed from 0 dB to A dB, the gain of the gain control amplifier 6 is changed from −A dB to 0 dB, and the gain of the gain control amplifier 214 is changed from 0 dB to A dB.

Figure 2:
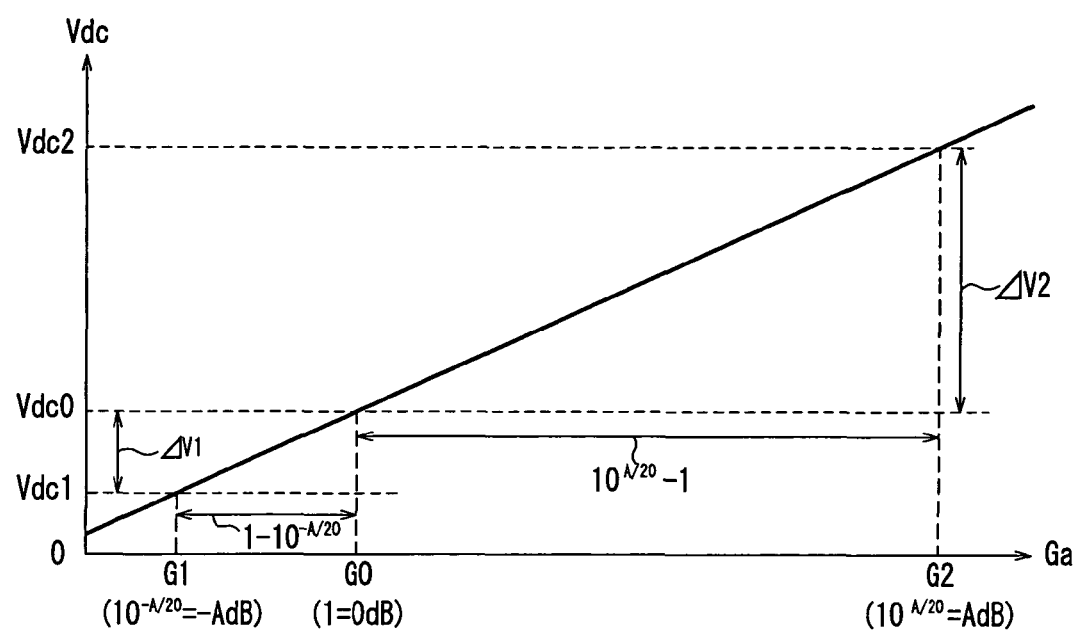
FIG. 2 is a graph for explaining an effect of the radio communication receiver circuit in Embodiment 1.

FIG. 2 shows the relationship between the gain of the gain control amplifier and the DC offset voltage output from the gain control amplifier. The horizontal axis indicates the gain (linear), and the vertical axis indicates the DC offset voltage. As shown in FIG. 2, the DC offset voltage increases in proportion to the gain. In FIG. 2, Vdc1 represents the DC offset voltage at gain G1=−A dB, Vdc0 represents the DC offset voltage at gain G0=0 dB, and Vdc2 represents the DC offset voltage at gain G2=A dB.

In the circuit of FIG. 1, when the gain is changed from 0 dB to A dB, the gain of the gain control amplifier 6 is changed from −A dB to 0 dB, and the amount of change ($\Delta V1$) in the DC offset voltage output from the gain control amplifier 6 is expressed by Formula (1).

$$\Delta V1 = Vdc0 - Vdc1 \quad (1)$$

In the circuit of FIG. 22, when the gain is changed from 0 dB to A dB, the gain of the gain control amplifier 214 is changed from 0 dB to A dB, and the amount of change ($\Delta V2$) in the DC offset voltage output from the gain control amplifier 214 is expressed by Formula (2).

$$\Delta V2 = Vdc2 - Vdc0 \quad (2)$$

The following is a comparison between the value of $\Delta V1$ and that of $\Delta V2$. As shown in FIG. 2, since the DC offset voltage output from the gain control amplifier is proportional to the linear gain, DC offset voltage fluctuations are inevitably smaller in changing the gain from −A dB to 0 dB than in changing the gain from 0 dB to A dB.

The linear gain is $10^{-A/20}$ for −A dB, 1 for 0 dB, and $10^{A/20}$ for A dB. The DC offset voltage is proportional to the linear gain. Therefore, the relationship between $\Delta V1$ and $\Delta V$ is expressed by Formula (3).

$$\Delta V2/\Delta V1 = (Vdc2 - Vdc0)/(Vdc0 - Vdc1) \quad (3)$$
$$= (10^{A/20} - 1)(1 - 10^{-A/20})$$
$$= 10^{A/20}$$

Formula 3 shows that $\Delta V2$ is $10^{A/20}$ times as large as $\Delta V1$. If A=20, $\Delta V2/\Delta V1=10$, and thus $\Delta V2$ is 10 times larger than $\Delta V1$.

The final output of the circuit corresponds to the output of the gain control amplifier 6 in FIG. 1. The gain of the gain control amplifier 6 is changed from −A dB to 0 dB with an increase in the gain of the circuit from 0 dB to A dB. Therefore, the output DC offset voltage from the gain control amplifier 6 is changed by $\Delta V1$, so that the DC offset voltage in the final output also fluctuates by $\Delta V1$.

In contrast, the gain of the gain control amplifier 214 is changed from 0 dB to A dB with an increase in the gain of the circuit from 0 dB to A dB. Therefore, the output DC offset voltage from the gain control amplifier 214 is changed by $\Delta V2$, which is $10^{A/20}$ times larger than $\Delta V1$. Consequently, in the final output, the DC offset voltage fluctuates by $\Delta V2$ when changing the gain, causing a transient response that converges in a time determined by the time constant of the high-pass filter 215.

Figure 3A:
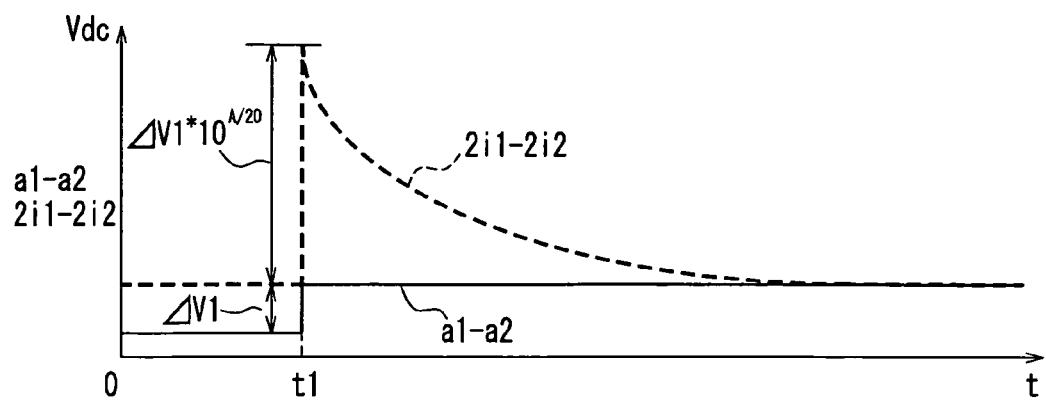
FIG. 3 is a waveform diagram showing a transient response of the radio communication receiver circuit in Embodiment 1.
Figure 3B:
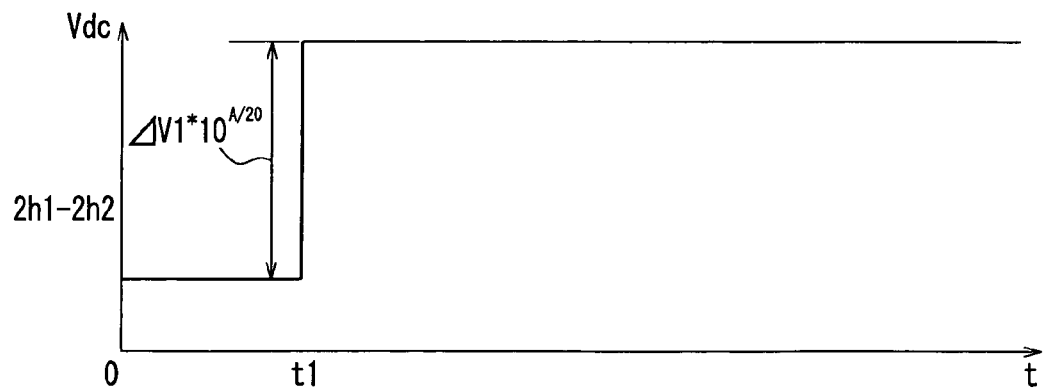

In FIG. 1, the two-phase final output of the circuit consists of a positive output a1 and a negative output a2. In FIG. 22, the two-phase output of the gain control amplifier 214 consists of a positive output $2h1$ and a negative output $2h2$, and the two-phase final output of the circuit consists of a positive output $2i1$ and a negative output $2i2$. FIGS. 3A and 3B show transient responses that occur in the outputs a1, a2, $2i1$, and $2i2$ and in the outputs $2h1$ and $2h2$, respectively, when the gains of the circuits in FIGS. 1 and 22 are changed from 0 dB to A dB.

As shown in FIG. 3A, a transient response occurs due to DC voltage fluctuations in the final output ($2i1$-$2i2$) of the circuit of FIG. 22, which is a conventional example. The magnitude of the DC voltage fluctuations is $10^{A/20}$ times larger than $\Delta V1$ in the circuit of FIG. 1. The DC offset voltage fluctuations in the final output (a1-a2) of the circuit of FIG. 1 can be reduced by $10^{-A/20}$ times as compared to those in the final output ($2i1$-$2i2$) of the circuit of FIG. 22. For example, if A=20 (i.e., the gain is changed from 0 dB to 20 dB), the DC offset voltage fluctuations of the circuit of this embodiment can be suppressed to one-tenth of those of the conventional circuit.

Moreover, the DC offset voltage is changed only slightly at the time of switching the gain. Therefore, even if the gain is changed significantly during the reception of signals, the signal quality is hardly degraded.

As described above, Embodiment 1 of the present invention can suppress not only a transient response due to DC voltage fluctuations, but also degradation of the signal quality, even if the gain is changed significantly during the reception of signals.

Embodiment 2

A direct conversion receiver circuit of Embodiment 2 of the present invention will be described by referring to FIGS. 4 and 5.

Figure 4:
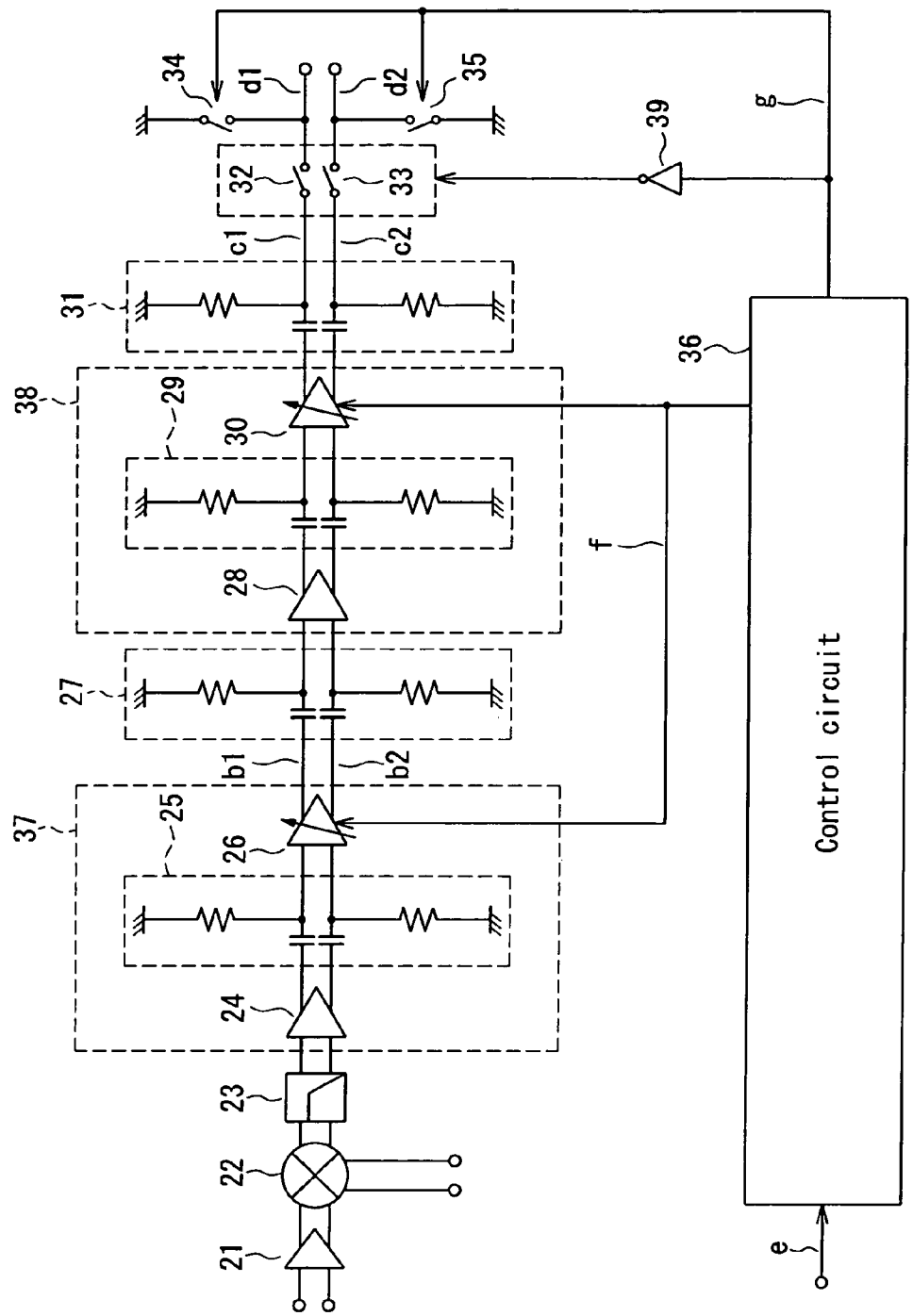
FIG. 4 is a circuit diagram showing the configuration of a radio communication receiver circuit in Embodiment 2 of the present invention.

FIG. 4 shows a baseband circuit that constitutes the receiver circuit of this embodiment. The baseband circuit includes a LNA 21, a mixer 22, and a low-pass filter 23, which may be the same as those used in the circuit of Embodiment 1 as shown in FIG. 1. After the low-pass filter 23, composite amplifiers 37, 38 including fixed gain amplifiers 24, 28, high-pass filters 25, 29, and gain control amplifiers 26, 30, respectively, are connected in multiple stages. The fixed gain amplifiers 24, 28, the high-pass filters 25, 29, and the gain control amplifiers 26, 30 also may be the same as those used in the circuit of FIG. 1. The gains of the fixed gain amplifiers 24, 28 are 0 dB or more. The maximum gains of the gain control amplifiers 26, 30 are 0 dB or less. Although the circuit of FIG. 4 uses two stages of the composite amplifiers 37, 38, two or more composite amplifiers may be connected in multiple stages.

In the subsequent stages of the composite amplifiers 37, 38, high-pass filters 27, 31 are connected, respectively. The high-pass filter 31 is connected to the output of the gain control amplifier 30 of the composite amplifier 38 in the last stage, and the output of the high-pass filter 31 is connected to first switches 32, 33 and second switches 34, 35.

Moreover, a control circuit 36 is connected to the gain control amplifiers 26, 30 through a gain control line f and to the first switches 32, 33 and the second switches 34, 35 through a switch control line g. An inverter 39 is inserted between the first switches 32, 33 and the control circuit 36. Thus, the control circuit 36 controls the first switches 32, 33, the second switches 34, 35, and the gains of the gain control amplifiers 26, 30.

The control circuit 36 has the following functions. When a gain-change pulse is input from a control circuit input line e, the control circuit 36 opens the first switches 32, 33 and closes the second switches 34, 35, and then switches the gains of the gain control amplifiers 26, 30. After a predetermined time has passed from the switching of the gains, the control circuit 36 closes the first switches 32, 33 and opens the second switches 34, 35.

The receiver circuit of FIG. 1 has only one gain control amplifier. Therefore, there is a limit in increasing the gain variable range while maintaining the distortion property or the like. In contrast, connecting the composite amplifiers 37, 38 in multiple stages as shown in FIG. 4 is effective to increase the gain variable range while maintaining the distortion property or the like.

Moreover, the control circuit 36 controls the first switches 32, 33, the second switches 34, 35, and the gain control amplifiers 26, 30 in synchronization with the gain-change pulse that is input from the control circuit input line e.

This configuration and control can increase the gain variable range while maintaining the distortion property or the like and suppress DC offset voltage fluctuations that may occur in the final output when the gains are changed.

A method for controlling the gain control amplifiers 26, 30, the first switches 32, 33, and the second switches 34, 35 by the control circuit 36 at the time of switching the gains while signals are input to the circuit of FIG. 4, and the resultant transient responses will be described by referring to FIG. 5. In FIG. 4, the two-phase output of the gain control amplifier 26 consists of a positive output b1 and a negative output b2. The two-phase output of the high-pass filter 31 consists of a positive output c1 and a negative output c2. Moreover, the two-phase final output of the circuit consists of a positive output d1 and a negative output d2.

The first switches 32, 33 are controlled by a signal of the switch control line g that has been inverted by the inverter 39. Therefore, the control of the first switches 32, 33 is always opposite to that of the second switches 34, 35. In other words, if the first switches 32, 33 are ON, then the second switches 34, 35 are OFF, and if the first switches 32, 33 are OFF, then the second switches 34, 35 are ON.

Figure 5:
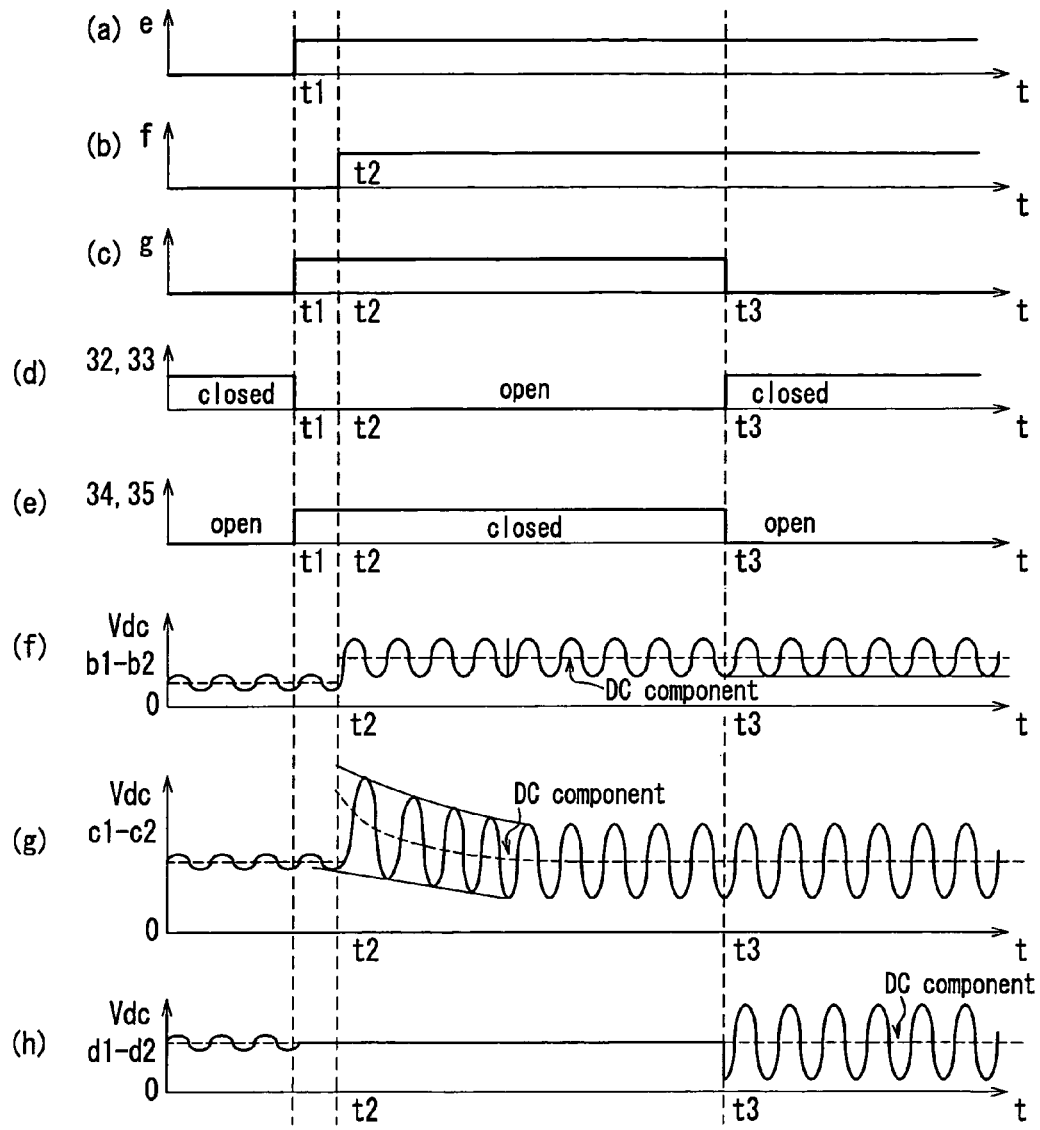
FIG. 5 is a waveform diagram showing a transient response of the radio communication receiver circuit in Embodiment 2.

In FIG. 5, (a) indicates a signal of the control circuit input line e, (b) indicates a signal of the gain control line f, (c) indicates a signal of the switch control line g, (d) indicates the state of the first switches 32, 33, (e) indicates the state of the second switches 34, 35, (f) indicates a pulse and a transient response in the output (b1-b2) of the gain control amplifier 26, (g) indicates a pulse and a transient response in the output (c1-c2) of the high-pass filter 31, and (h) indicates a pulse and a transient response in the final output (d1-d2) of the circuit of FIG. 4.

The control of switching the gains will be described below. The first switches 32, 33 and the second switches 34, 35 are turned ON or OFF depending on whether the switch control line g is High or Low.

When a gain-change pulse is input from the control circuit input line e at time t1, the switch control line g is changed from Low to High. Therefore, the first switches 32, 33 are turned OFF and the second switches 34, 35 are turned ON. At time t2, the gains of the gain control amplifiers 26, 30 are switched by a signal of the gain control line f. At time t3, the switch control line g is changed from High to Low, and the first switches 32, 33 are turned ON and the second switches 34, 35 are turned OFF. A transient response involved in the above control will be described below.

First, a transient response in the output (b1, b2) of the gain control amplifier 26 will be described. In this node, as shown in FIG. 5(f), no phenomenon such as a transient response occurs at t1. When the gains of the gain control amplifiers are changed at t2, the signal is amplified to cause a step change in the DC offset voltage. However, this change in the DC offset voltage is small enough not to be a problem. At t3, there is also no phenomenon such as a transient response. Thus, in the output (b1, b2) of the gain control amplifier 26, the DC offset voltage fluctuates only at t2.

Next, a transient response in the output (c1, c2) of the high-pass filter 31 will be described. In this node, as shown in FIG. 5 (g), no phenomenon such as a transient response occurs at t1. When the gains of the gain control amplifiers are changed at t2, the signal is amplified, and the DC offset voltage fluctuates in synchronization with the gain switching timing. Consequently, a transient response occurs which converges in a time determined by the time constant of the high-pass filter 31. The DC offset voltage fluctuates because the fluctuation in the DC offset voltage output from the gain control amplifier 26 is amplified with the fixed gain amplifier 28 and the gain control amplifier 30. Therefore, the DC offset voltage fluctuations in the output (c1, c2) of the high-pass filter 31 become larger in magnitude, but converge in a predetermined period of time. At t3, there is no phenomenon such as a transient response. Thus, in the output (c1, c2) of the high-pass filter 31, a transient response occurs only at t2.

Next, a transient response in the final output (d1, d2) in FIG. 4 will be described. At t1, the first switches 32, 33 are OFF and the second switches 34, 35 are ON. Therefore, as shown in FIG. 5 (h), the final output (d1, d2) is connected to GND, and no signal is output. Since the GND is the same as the reference potential of the high-pass filter 31, DC offset fluctuations do not occur, even if the final output (d1, d2) is connected to the GND at t1. At t2, the state of the final output (d1, d2) remains unchanged from t1.

At t3, the first switches 32, 33 are ON and the second switches 34, 35 are OFF. Therefore, as shown in FIG. 5 (h), a signal of the high-pass filter 31 is transmitted directly to the final output (d1, d2).

The time t3 is set so that the period of time from t2 to t3 is longer than the convergence time of a transient response that occurs in the output (c1, c2) of the high-pass filter 31. With this time setting, the transient response in the output (c1, c2) of the high-pass filter 31 has converged at t3. Thus, a transient response due to DC offset fluctuations does not occur in the final output (d1, d2).

As described above, Embodiment 2 of the present invention can increase the gain variable range of the circuit and suppress a transient response due to DC voltage fluctuations resulting from the presence of a signal in the final output, even if the gains are changed significantly during the reception of signals.

Embodiment 3

A direct conversion receiver circuit of Embodiment 3 of the present invention will be described by referring to FIG. 6.

Figure 6:
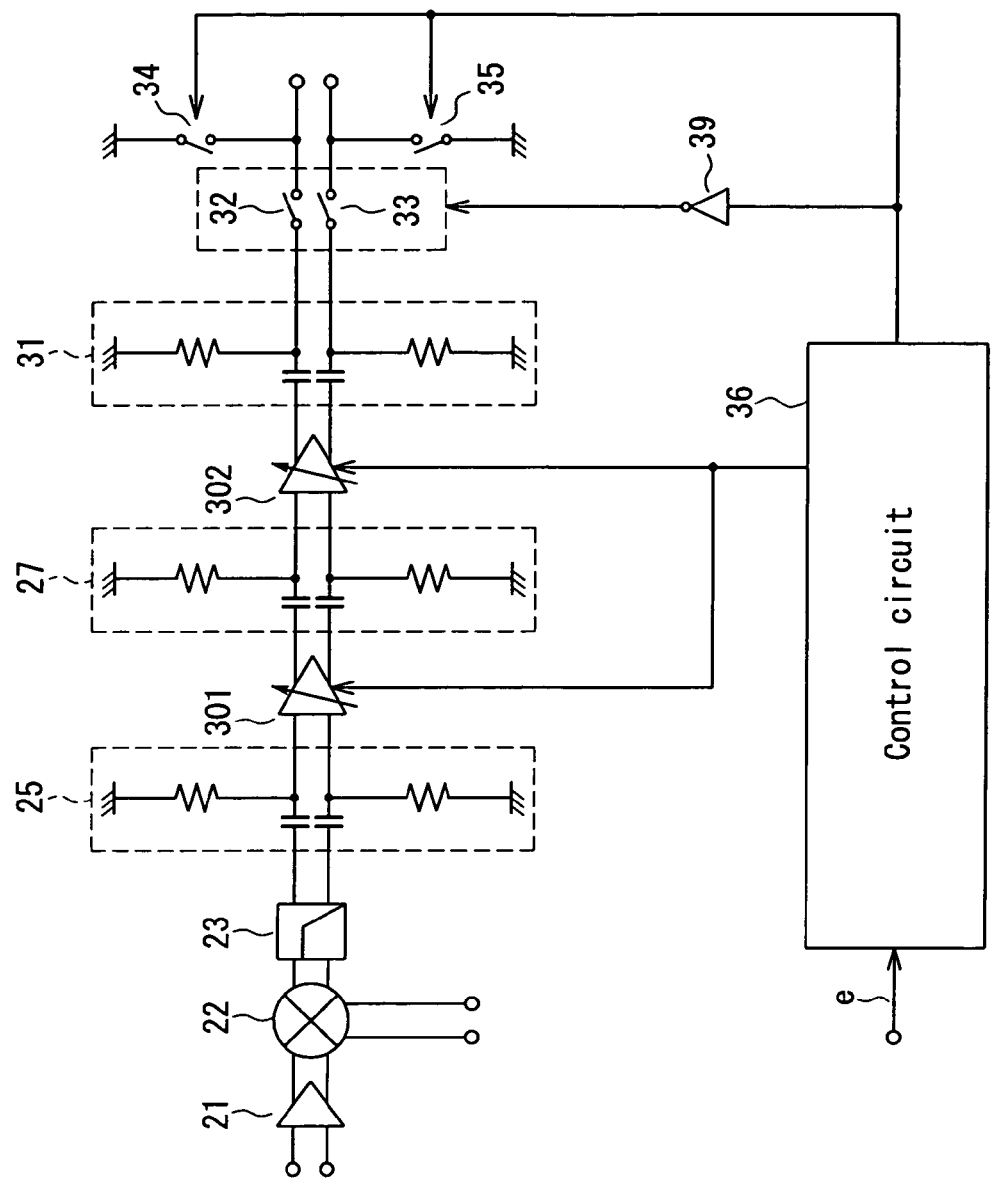
FIG. 6 is a circuit diagram showing the configuration of a radio communication receiver circuit in Embodiment 3 of the present invention.

FIG. 6 shows a baseband circuit that constitutes the receiver circuit of this embodiment. The baseband circuit is formed by removing the fixed gain amplifiers 24, 28 and the high-pass filter 29 from the circuit of Embodiment 2 as shown in FIG. 4. This circuit differs from the circuit of FIG. 4 in that the gains of a plurality of gain control amplifiers 301, 302 are 0 dB or more. In FIG. 6, the elements having the same functions as those in FIG. 4 are denoted by the same reference numerals.

Like the circuit of Embodiment 2, the control circuit 36 has the following functions. When a gain-change pulse is input, the control circuit 36 opens the first switches 32, 33 and closes the second switches 34, 35, and then switches the gains of the gain control amplifiers 301, 302. After a predetermined time has passed from the switching of the gains, the control circuit 36 closes the first switches 32, 33 and opens the second switches 34, 35.

The circuit of FIG. 6 has the same configuration as the circuit of FIG. 4 except that the fixed gain amplifiers are removed, the number of high-pass filters is decreased, and the maximum gains of the gain control amplifiers 301, 302 are 0 dB or more. The method for controlling the gains of the gain control amplifiers 301, 302, the first switches 32, 33, and the second switches 34, 35 also is the same. Therefore, when a transient response at the time of switching the gains is compared between the circuit of FIG. 4 and the circuit of FIG. 6, since the maximum gains of the gain control amplifiers 301, 302 are 0 dB or more, DC offset voltage fluctuations are larger in the outputs of the gain control amplifiers 301, 302 in FIG. 6 than in the outputs of the gain control amplifiers 26, 30 in FIG. 4.

Accordingly, compared to the transient response that occurs in the output of the high-pass filter 31 closest to the final output in FIG. 4, when the gains are switched, the magnitude of the DC offset voltage fluctuations is larger and a transient response time is longer in the output of the high-pass filter 31 closest to the final output in FIG. 6.

For this reason, the period of time from switching of the gains of the gain control amplifiers 301, 302 to closing of the first switches 32, 33 and opening of the second switches 34, 35 is made longer in the circuit of FIG. 6 than in the circuit of FIG. 4. Thus, the first switches 32, 33 are closed and the second switches 34, 35 are opened after the transient response in the output of the high-pass filter 31 has converged, so that a transient response due to DC offset fluctuations can be suppressed in the final output.

Moreover, compared to the circuit of FIG. 4, the circuit of FIG. 6 can eliminate the fixed gain amplifiers and decrease the number of high-pass filters, thereby reducing the circuit size.

As described above, Embodiment 3 of the present invention can increase the gain variable range of the circuit, reduce the circuit size, and suppress a transient response due to DC voltage fluctuations resulting from the presence of a signal in the final output, even if the gains are changed significantly during the reception of signals.

Embodiment 4

A direct conversion receiver circuit of Embodiment 4 of the present invention will be described by referring to FIGS. 7, 8 and 9.

Figure 7:
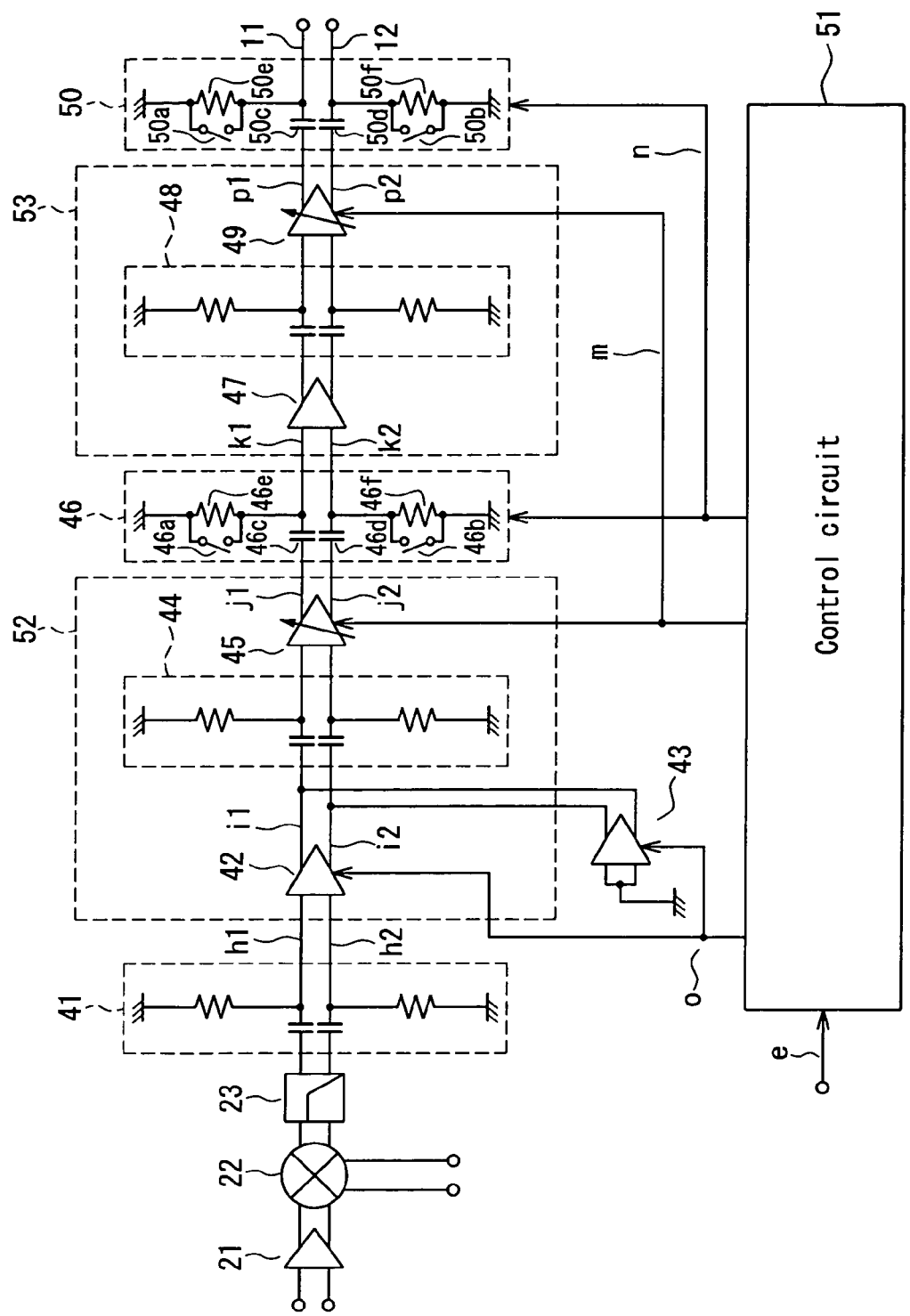
FIG. 7 is a circuit diagram showing the configuration of a radio communication receiver circuit in Embodiment 4 of the present invention.

FIG. 7 shows a baseband circuit that constitutes the receiver circuit of this embodiment. The baseband circuit includes a LNA 21, a mixer 22, and a low-pass filter 23, which may be the same as those used in the circuit of Embodiment 1 as shown in FIG. 1. Moreover, composite amplifiers 52, 53 including fixed gain amplifiers 42, 47, high-pass filters 44, 48, and gain control amplifiers 45, 49, respectively, are connected in multiple stages (two stages in FIG. 7). The fixed gain amplifiers 42, 47, the high-pass filters 44, 48, and the gain control amplifiers 45, 49 also may be the same as those used in the circuit of FIG. 1. The gains of the fixed gain amplifiers 42, 47 are 0 dB or more. The maximum gains of the gain control amplifiers 45, 49 are 0 dB or less.

A high-pass filter 46 is inserted between the composite amplifiers 52, 53. A high-pass filter 50 is connected to the output of the gain control amplifier 49 closest to the output of the circuit. A high-pass filter 41 is inserted on the input side of the first fixed gain amplifier 42 closest to the input of the circuit. A dummy amplifier 43 has the same configuration as the first fixed gain amplifier 42, and the output terminals of the dummy amplifier 43 are connected to the output terminals of the first fixed gain amplifier 42. A voltage equal to the input DC voltage of the first fixed gain amplifier 42 is input to the dummy amplifier 43.

Among the high-pass filters, the high-pass filters 46, 50 that are connected to the outputs of the gain control amplifiers 45, 49 include first resistors 46*e*, 46*f* and 50*e*, 50*f*, first capacitors 46*c*, 46*d* and 50*c*, 50*d*, and third switches 46*a*, 46*b* and 50*a*, 50*b*, respectively.

Moreover, a control circuit 51 controls the first fixed gain amplifier 42, the dummy amplifier 43, and the gains of the gain control amplifiers 45, 49 and ON/OFF of the third switches 46*a*, 46*b*, 50*a*, and 50*b*.

The control circuit 51 has the following functions. When a gain-change pulse is input from the control circuit input line e, the control circuit 51 puts the first fixed gain amplifier 42 into a sleep state and the dummy amplifier 43 into an active state, closes the third switches 46*a*, 46*b*, 50*a*, and 50*b*, and then switches the gains of the gain control amplifiers 45, 49. After a predetermined time has passed from the switching of the gains, the control circuit 51 opens the third switches 46*a*, 46*b*, 50*a*, and 50*b*, and subsequently puts the first fixed gain amplifier 42 into the active state and the dummy amplifier 43 into the sleep state.

In the receiver circuit of Embodiment 2 as shown in FIG. 4, the DC offset voltage does not fluctuate in the final output (d1, d2), even if the gains are changed significantly during the reception of signals. At the time of switching the gains, however, the first switches 32, 33 are OFF and the second switches 34, 35 are ON for a predetermined period of time, which is equal to or longer than the time constants of the high-pass filters 27, 29, and 31. Consequently, no signal is transmitted to the final output, and a signal is lost for a long time.

Therefore, by performing the above control with the circuit configuration as shown in FIG. 7, this embodiment can increase the gain variable range of the circuit and suppress a transient response due to DC voltage fluctuations in the final output, even if the gains are changed significantly during the reception of signals, while it is also possible to reduce the time of signal loss when the gains are switched. A method for controlling the gain control amplifiers 45, 49, the third switches 46*a*, 46*b*, 50*a*, and 50*b* of the high-pass filters 46, 50, the first fixed gain amplifier 42, and the dummy amplifier 43 by the control circuit 51 at the time of switching the gains while signals are input to the circuit of FIG. 7, and the resultant transient responses will be described by referring to FIGS. 8 and 9.

In FIG. 7, the two-phase output of the high-pass filter 41 consists of a positive output h1 and a negative output h2. The two-phase output of the first fixed gain amplifier 42 consists of a positive output i1 and a negative output i2. The two-phase output of the gain control amplifier 45 consists of a positive output j1 and a negative output j2. The two-phase output of the high-pass filter 46 consists of a positive output k1 and a negative output k2. The two-phase output of the gain control amplifier 49 consists of a positive output p1 and a negative output p2. The two-phase output of the high-pass filter 50 connected to the final output consists of a positive output l1 and a negative output l2. The control circuit input line e is used for input to the control circuit 51. A gain control line m supplies a signal for controlling the gain control amplifiers 45, 49 from the control circuit 51. A switch control line n supplies a signal for controlling the third switches 46a, 46b, 50a, and 50b of the high-pass filters 46, 50 from the control circuit 51. An amplifier control line o supplies a signal for controlling the first fixed gain amplifier 42 and the dummy amplifier 43 from the control circuit 51.

When the amplifier control line o is High, the first fixed gain amplifier 42 is in the sleep state, and the dummy amplifier 43 is in the active state. When the amplifier control line o is Low, the first fixed gain amplifier 42 is in the active state, and the dummy amplifier 43 is in the sleep state.

The third switches 46a, 46b, 50a, and 50b are turned ON or OFF depending on whether the switch control line n is High or Low.

Figure 8:
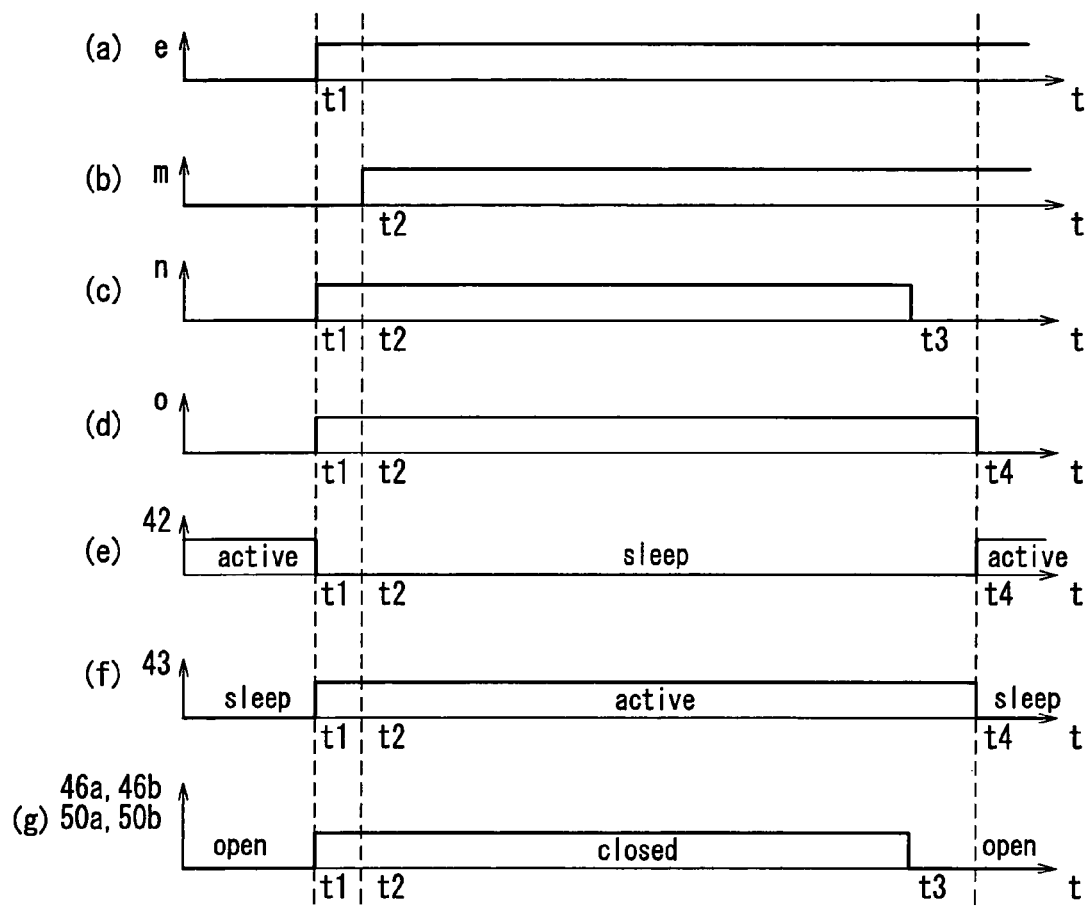
FIG. 8 is a waveform diagram showing a transient response of the radio communication receiver circuit in Embodiment 4.

In FIG. 8, (a) indicates a signal of the control circuit input line e, (b) indicates a signal of the gain control line m, (c) indicates a signal of the switch control line n, (d) indicates a signal of the amplifier control line o, (e) indicates the state of the first fixed gain amplifier 42, (f) indicates the state of the dummy amplifier 43, and (g) indicates the state of the third switches 46a, 46b, 50a, and 50b.

Figure 9:
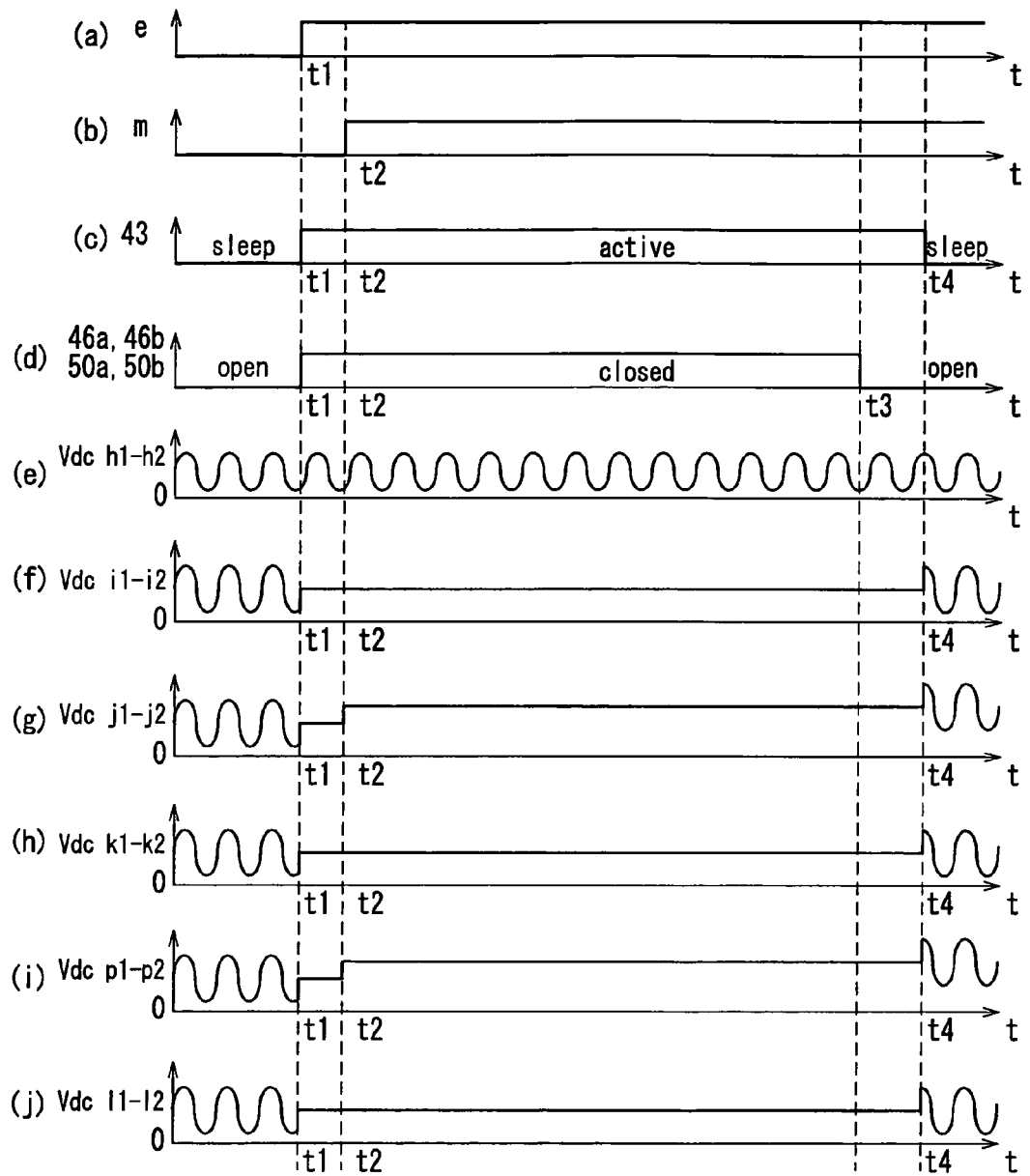
FIG. 9 is a waveform diagram showing a transient response of the radio communication receiver circuit in Embodiment 4.

In the waveform diagram of FIG. 9, (a) indicates a signal of the control circuit input line e, (b) indicate a pulse of the gain control line m, (c) indicates the state of the dummy amplifier 43, (d) indicates the state of the third switches 46a, 46b, 50a, and 50b, (e) indicates a transient response in the output (h1-h2) of the high-pass filter 41, (f) indicates a transient response in the output (i1-i2) of the first fixed gain amplifier 42, (g) indicates a transient response in the output (j1-j2) of the gain control amplifier 45, (h) indicates a transient response in the output (k1-k2) of the high-pass filter 46, (i) indicates a transient response in the output (p1-p2) of the gain control amplifier 49, and (j) indicates a transient response in the output (l1-l2) of the high-pass filter 50 connected to the final output.

The control of switching the gains will be described by referring to FIG. 8. As shown in FIG. 8(a), when a gain-change pulse is input from the control circuit input line e at time t1, the switch control line n is changed from Low to High. Therefore, the third switches 46a, 46b, 50a, and 50b of the high-pass filters 46, 50 are turned ON. At the same time, the amplifier control line o is changed from Low to High. Therefore, as shown in FIG. 8 (e) and (f), the first fixed gain amplifier 42 is changed from the active state to the sleep state, and the dummy amplifier 43 is changed from the sleep state to the active state.

At time t2, the gains of the gain control amplifiers 45, 49 are switched by a signal of the gain control line m. At time t3, the switch control line n is changed from High to Low, and the third switches 46a, 46b, 50a, and 50b of the high-pass filters 46, 50 are turned OFF, as shown in FIG. 8(g).

At time t4, the amplifier control line o is changed from High to Low. Therefore, the first fixed gain amplifier 42 is changed from the sleep state to the active state, and the dummy amplifier 43 is changed from the active state to the sleep state.

A transient response involved in the above control will be described by referring to FIG. 9. First, the output (h1, h2) of the high-pass filter 41 will be described, as shown in FIG. 9(e). This node is independent of the gain switching control. Therefore, neither a change in signal level nor a transient response due to DC offset voltage fluctuations occurs between t1 and t4.

Next, the output (i1, i2) of the first fixed gain amplifier 42 will be described, as shown in FIG. 9(f). The dummy amplifier 43 has exactly the same configuration as the first fixed gain amplifier 42, and a voltage equal to the input DC voltage of the first fixed gain amplifier 42 is input to the dummy amplifier 43. Therefore, the output DC voltages of the first fixed gain amplifier 42 and the dummy amplifier 43 are the same.

At t1, the first fixed gain amplifier 42 is changed to the sleep state, and the dummy amplifier 43 is changed to the active state. In this case, the input DC voltage of the high-pass filter 44 is shifted from the output DC voltage of the first fixed gain amplifier 42 to that of the dummy amplifier 43. However, since the output DC voltages are the same, DC voltage fluctuations do not occur at t1. Moreover, a signal is interrupted by the transitions of the first fixed gain amplifier 42 to the sleep state and the dummy amplifier 43 to the active state. Therefore, only a DC voltage is present in the output (i1, i2) of the first fixed gain amplifier 42 after t1, and this condition continues until t4. At t4, since the first fixed gain amplifier 42 is changed to the active state, and the dummy amplifier 43 is changed to the sleep state, a signal from the output (h1, h2) of the high-pass filter 41 is transmitted through the first fixed gain amplifier 42. In this case, although the active circuit is shifted from the dummy amplifier 43 to the first fixed gain amplifier 42, a transient response does not occur due to DC offset voltage fluctuations resulting from the presence of the signal because the output DC voltage is the same.

Next, the output (j1, j2) of the gain control amplifier 45 will be described, as shown in FIG. 9(g). At t1, the first fixed gain amplifier 42 is changed to the sleep state, and the dummy amplifier 43 is changed to the active state. Therefore, a signal is interrupted, and only a DC is present in the output (j1, j2) of the gain control amplifier 45 after t1. Thus, a transient response due to DC voltage fluctuations does not occur at t1. At t2, the gain of the gain control amplifier 45 is changed to cause a step change in the DC offset voltage of the output (j1, j2). However, this change is small and not a problem. Since a signal still is interrupted by the first fixed gain amplifier 42, only a. DC is present in the output (j1, j2) of the gain control amplifier 45 between t2 and t4. At t4, the first fixed gain amplifier 42 is active, so that a signal is transmitted. Thus, a transient response due to DC voltage fluctuations resulting from the presence of a signal does not occur at both t1 and t4.

Next, the output (k1, k2) of the high-pass filter 46 will be described, as shown in FIG. 9(h). At t1, the switch control line n is changed from Low to High, and the third switches 46a, 46b of the high-pass filter 46 are turned ON. Then, the output (k1, k2) of the high-pass filter 46 is fixed to a reference voltage of the high-pass filter. Therefore, only a DC is present in the output (k1, k2) of the high-pass filter 46 after t1. Thus, a transient response due to DC voltage fluctuations does not occur at t1. At t3, the switch control line n is changed from High to Low, and the third switches 46a, 46b of the high-pass filter 46 are turned OFF. However, a signal has been interrupted because the first fixed gain amplifier 42 is in the sleep state, and the dummy amplifier 43 is in the active state. Accordingly, DC voltage fluctuations do not occur in the output (k1, k2) of the high-pass filter 46, causing no transient response. At t4, although a signal is transmitted by the transitions of the first fixed gain amplifier 42 to the active state and the dummy amplifier 43 to the sleep state, a transient response does not occur due to the DC offset voltage resulting from the presence of the signal in the output (k1, k2) of the high-pass filter 46.

Next, the output (p1, p2) of the gain control amplifier 49 will be described, as shown in FIG. 9(i). At t1, the first fixed gain amplifier 42 is changed to the sleep state, and the dummy amplifier 43 is changed to the active state. Therefore, a signal is interrupted, and only a DC is present in the output (p1, p2) of the gain control amplifier 49 after t1. Thus, a transient response due to DC voltage fluctuations does not occur at t1. At t2, the gain of the gain control amplifier 49 is changed to cause a step change in the DC offset voltage of the output (p1, p2). However, this change is small and not a problem. Since a signal still is interrupted by the first fixed gain amplifier 42, only a DC is present in the output (p1, p2) of the gain control amplifier 49 between t2 and t4. At t4, the first fixed gain amplifier 42 is active, so that a signal is transmitted. Thus, a transient response due to DC voltage fluctuations resulting from the presence of a signal does not occur at both t1 and t4.

Finally, the output (l1, l2) of the high-pass filter 50, which is the final output of the circuit of FIG. 7, will be described, as shown in FIG. 9(j). At t1, the switch control line n is changed from Low to High, and the third switches 50a, 50b of the high-pass filter 50 are turned ON. Then, the output (l1, l2) of the high-pass filter 50 is fixed to a reference voltage of the high-pass filter. Therefore, only a DC is present in the output (l1, l2) of the high-pass filter 50 after t1. Thus, a transient response due to DC voltage fluctuations does not occur at t1. At t3, the switch control line n is changed from High to Low, and the third switches 50a, 50b of the high-pass filter 50 are turned OFF. However, a signal has been interrupted because the first fixed gain amplifier 42 is in the sleep state, and the dummy amplifier 43 is in the active state. Accordingly, DC voltage fluctuations do not occur in the output (l1, l2) of the high-pass filter 50, causing no transient response. At t4, although a signal is transmitted by the transitions of the first fixed gain amplifier 42 to the active state and the dummy amplifier 43 to the sleep state, a transient response does not occur due to the DC offset voltage resulting from the presence of the signal in the output (l1, l2) of the high-pass filter 50.

As described above, when the gains are switched at t2, the third switches 46a, 46b, 50a, and 50b of the high-pass filters 46, 50 are ON, and the outputs (k1, k2) (l1, l2) are fixed to the reference voltages of the high-pass filters, respectively. Therefore, a transient response due to DC voltage fluctuations does not occur in principle at the time of switching the gains. Thus, the period of time from t2 to t4 in FIGS. 8 and 9 can be much shorter than that from t2 to t3 in FIG. 5. Consequently, the configuration and control of the circuit of FIG. 7 can reduce the time of signal loss as compared to the circuit of FIG. 4.

Embodiment 4 of the present invention can increase the gain variable range of the circuit and suppress a transient response due to DC voltage fluctuations in the final output, even if the gains are changed significantly during the reception of signals. Moreover, it is also possible to reduce the time of signal loss when the gains are switched.

Embodiment 5

A direct conversion receiver circuit of Embodiment 5 of the present invention will be described by referring to FIG. 10.

Figure 10:
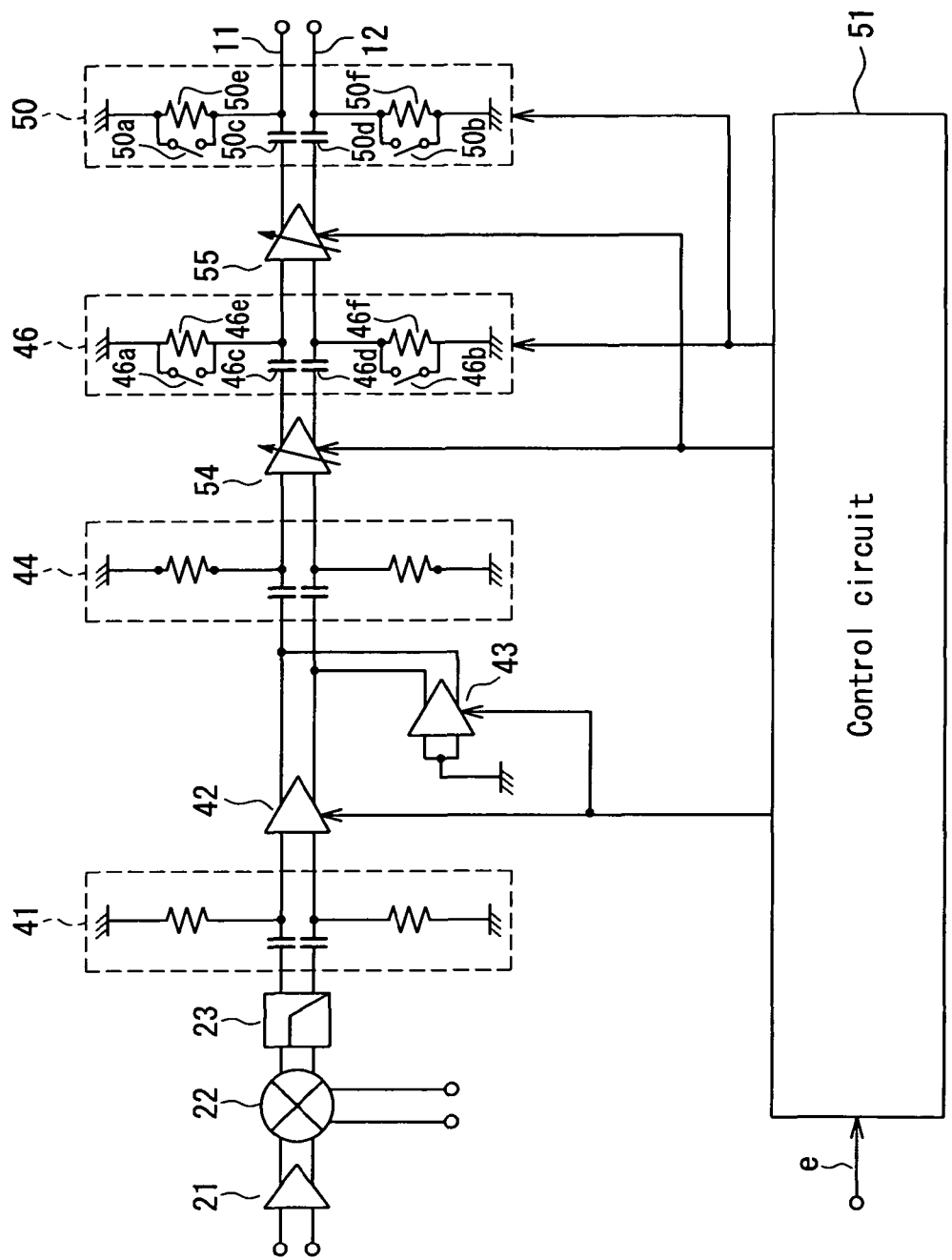
FIG. 10 is a circuit diagram showing the configuration of a radio communication receiver circuit in Embodiment 5 of the present invention.

FIG. 10 shows a baseband circuit that constitutes the receiver circuit of this embodiment. The baseband circuit is the same in configuration as the circuit of Embodiment 4 as shown in FIG. 7 except that the number of fixed gain amplifiers is decreased. This circuit includes a LNA 21, a mixer 22, a low-pass filter 23, a plurality of high-pass filters 41, 44, 46, and 50, a plurality of gain control amplifiers 54, 55, a fixed gain amplifier 42, a dummy amplifier 43, and a control circuit 51. In FIG. 10, the elements having the same functions as those in FIG. 7 are denoted by the same reference numerals.

The gains of the gain control amplifiers 54, 44 are 0 dB or more. Like the circuit of FIG. 7, the control circuit 51 controls the fixed gain amplifier 42, the dummy amplifier 43, the third switches 46a, 46b, 50a, and 50b of the high-pass filters 46, 50 connected to the respective outputs of the gain control amplifiers 54, 55, and the gains of the gain control amplifiers 54, 55.

Moreover, the control circuit 51 has the following functions. When a gain-change pulse is input, the control circuit 51 puts the fixed gain amplifier 42 into a sleep state and the dummy amplifier 43 into an active state, closes the third switches 46a, 46b, 50a, and 50b, and then switches the gains of the gain control amplifiers 54, 55. After a predetermined time has passed from the switching of the gains, the control circuit 51 opens the third switches 46a, 46b, 50a, and 50b, and subsequently puts the fixed gain amplifier 42 into the active state and the dummy amplifier 43 into the sleep state.

The circuit of FIG. 10 has the same configuration as the circuit of FIG. 7 except that the number of fixed gain amplifiers and high-pass filters is decreased, and the maximum gains of the gain control amplifiers 54, 55 are 0 dB or more. The method for controlling the fixed gain amplifier 42, the dummy amplifier 43, the third switches 46a, 46b, 50a, and 50b of the high-pass filters 46, 50, and the gains of the gain control amplifiers 54, 55 also is the same.

Therefore, when a transient response at the time of switching the gains is compared between the circuit of FIG. 7 and the circuit of FIG. 10, since the maximum gains of the gain control amplifiers 54, 55 are 0 dB or more, DC offset voltage fluctuations are larger in the outputs of the gain control amplifiers 54, 55 in FIG. 10 than in the outputs of the gain control amplifiers 45, 49 in FIG. 7 at t2. However, a transient response in the final output in FIG. 10 is the same as that in the final output in FIG. 7, and there is no transient response due to DC offset fluctuations.

Moreover, compared to the circuit of FIG. 7, the circuit of FIG. 10 can decrease the number of fixed gain amplifiers and high-pass filters, thereby reducing the circuit size.

As described above, Embodiment 5 of the present invention can reduce the circuit size, increase the gain variable range of the circuit, and suppress a transient response due to DC voltage fluctuations resulting from the presence of a signal in the final output, even if the gains are changed significantly during the reception of signals. Moreover, it is also possible to reduce the time of signal loss when the gains are switched.

Embodiment 6

A direct conversion receiver circuit of Embodiment 6 of the present invention will be described by referring to FIGS. 11, 12 and 13.

Figure 11:
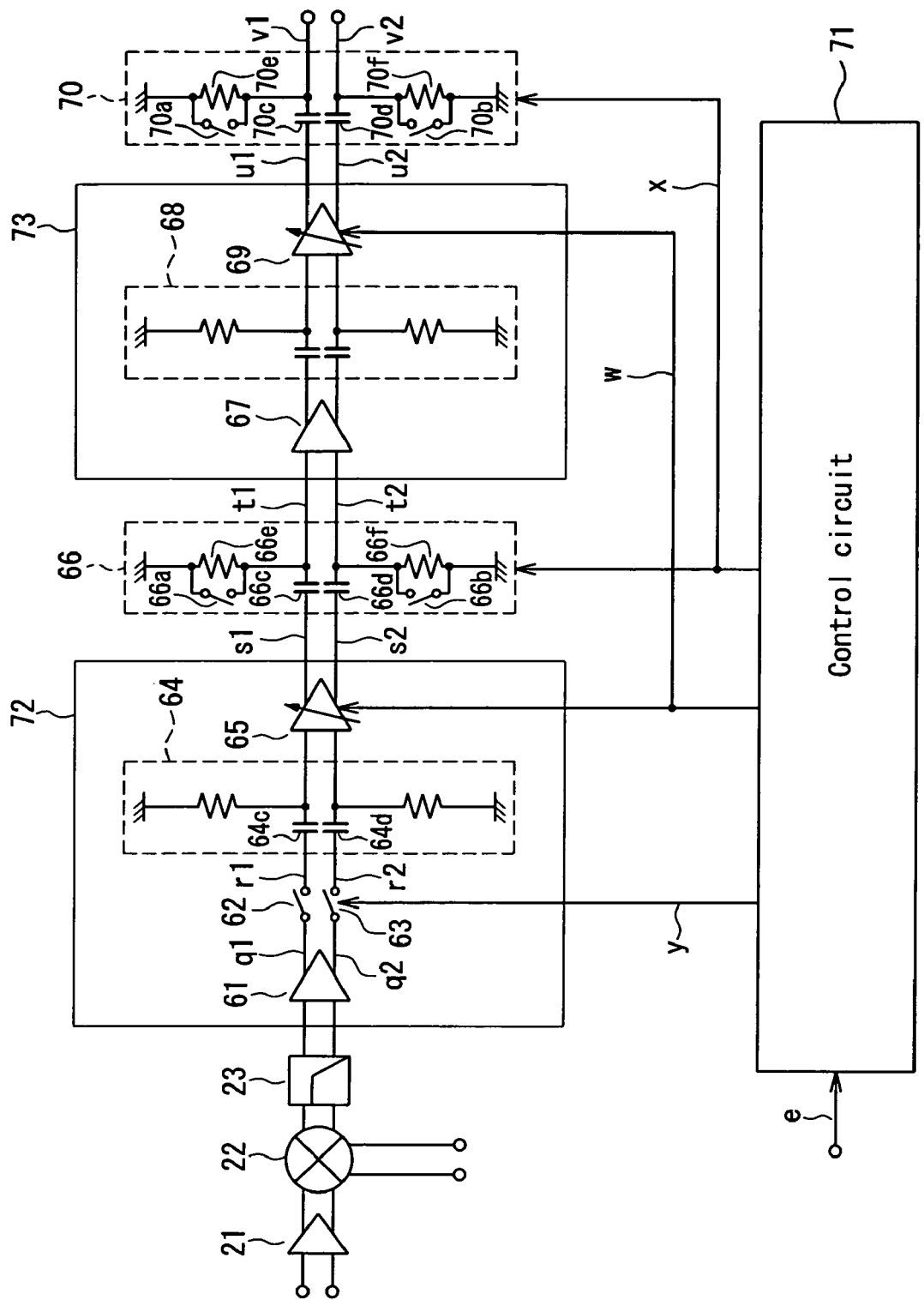
FIG. 11 is a circuit diagram showing the configuration of a radio communication receiver circuit in Embodiment 6 of the present invention.

FIG. 11 shows a baseband circuit that constitutes the receiver circuit of this embodiment. The baseband circuit includes a LNA 21, a mixer 22, and a low-pass filter 23, which may be the same as those used in the circuit of Embodiment 1 as shown in FIG. 1. After the low-pass filter 23, composite amplifiers 72, 73 including fixed gain amplifiers 61, 67, high-pass filters 64, 68, and gain control amplifiers 65, 69, respectively, are connected in multiple stages. The fixed gain amplifiers 61, 67, the high-pass filters 64, 68, and the gain control amplifiers 65, 69 also may be the same as those used in the circuit of FIG. 1. The gains of the fixed gain amplifiers 61, 67 are 0 dB or more. The maximum gains of the gain control amplifiers 65, 69 are 0 dB or less. Although the circuit of FIG. 11 uses two stages of the composite amplifiers 72, 73, two or more composite amplifiers may be connected in multiple stages.

In the subsequent stages of the composite amplifiers 72, 73, high-pass filters 66, 70 are connected, respectively. Fourth switches 62, 63 are inserted on the output side of the first fixed gain amplifier 61 closest to the input of the receiver circuit. Like the circuit of Embodiment 4 as shown in FIG. 7, the high-pass filters 66, 70 that are connected to the outputs of the gain control amplifiers 65, 69 include first resistors 66e, 66f and 70e, 70f, first capacitors 66c, 66d and 70c, 70d, and third switches 66a, 66b and 70a, 70b, respectively. Moreover, a control circuit 71 controls ON/OFF of the fourth switches 62, 63 and the third switches 66a, 66b, 70a, and 70b and the gains of the gain control amplifiers 65, 69.

The control circuit 71 has the following functions. When a gain-change pulse is input, the control circuit 71 opens the fourth switches 62, 63, closes the third switches 66a, 66b, 70a, and 70b, and then switches the gains of the gain control amplifiers 65, 69. After a predetermined time has passed from the switching of the gains, the control circuit 71 opens the third switches 66a, 66b, 70a, and 70b, and subsequently closes the fourth switches 62, 63.

In the receiver circuit of Embodiment 2 as shown in FIG. 4, the DC offset voltage does not fluctuate in the final output (d1, d2), even if the gains are changed significantly during the reception of signals. At the time of switching the gains, however, the first switches 32, 33 are OFF and the second switches 34, 35 are ON for a predetermined period of time, which is equal to or longer than the time constants of the high-pass filters 27, 29, and 31. Consequently, no signal is transmitted to the final output, and a signal is lost for a long time.

Therefore, by performing the above control with the circuit configuration as shown in FIG. 11, this embodiment can increase the gain variable range of the circuit and suppress a transient response due to DC voltage fluctuations in the final output, even if the gains are changed significantly during the reception of signals. Moreover, it is also possible to reduce the time of signal loss when the gains are switched.

A method for controlling the gain control amplifiers 65, 69, the third switches 66a, 66b, 70a, and 70b of the high-pass filters 66, 70, and the fourth switches 62, 63 by the control circuit 71 at the time of switching the gains while signals are input to the circuit of FIG. 11, and the resultant transient responses will be described by referring to FIGS. 12 and 13.

In FIG. 11, the two-phase output of the first fixed gain amplifier 61 consists of a positive output q1 and a negative output q2. The two-phase output of the fourth switches 62, 63 consists of a positive output r1 and a negative output r2. The two-phase output of the gain control amplifier 65 consists of a positive output s1 and a negative output s2. The two-phase output of the high-pass filter 66 consists of a positive output t1 and a negative output t2. The two-phase output of the gain control amplifier 69 consists of a positive output u1 and a negative output u2. The two-phase output of the high-pass filter 70 connected to the final output consists of a positive output v1 and a negative output v2.

A control circuit input line e is input to the control circuit 71. A gain control line w controls the gain control amplifiers 65, 69. A high-pass filter switch control line x controls the third switches 66a, 66b, 70a, and 70b of the high-pass filters 66, 70. A signal switch control line y controls the fourth switches 62, 63.

The third switches 66a, 66b, 70a, and 70b are turned ON or OFF depending on whether the high-pass filter switch control line x is High or Low. The fourth switches 62, 63 are turned ON or OFF depending on whether the signal switch control line y is High or Low.

Figure 12:
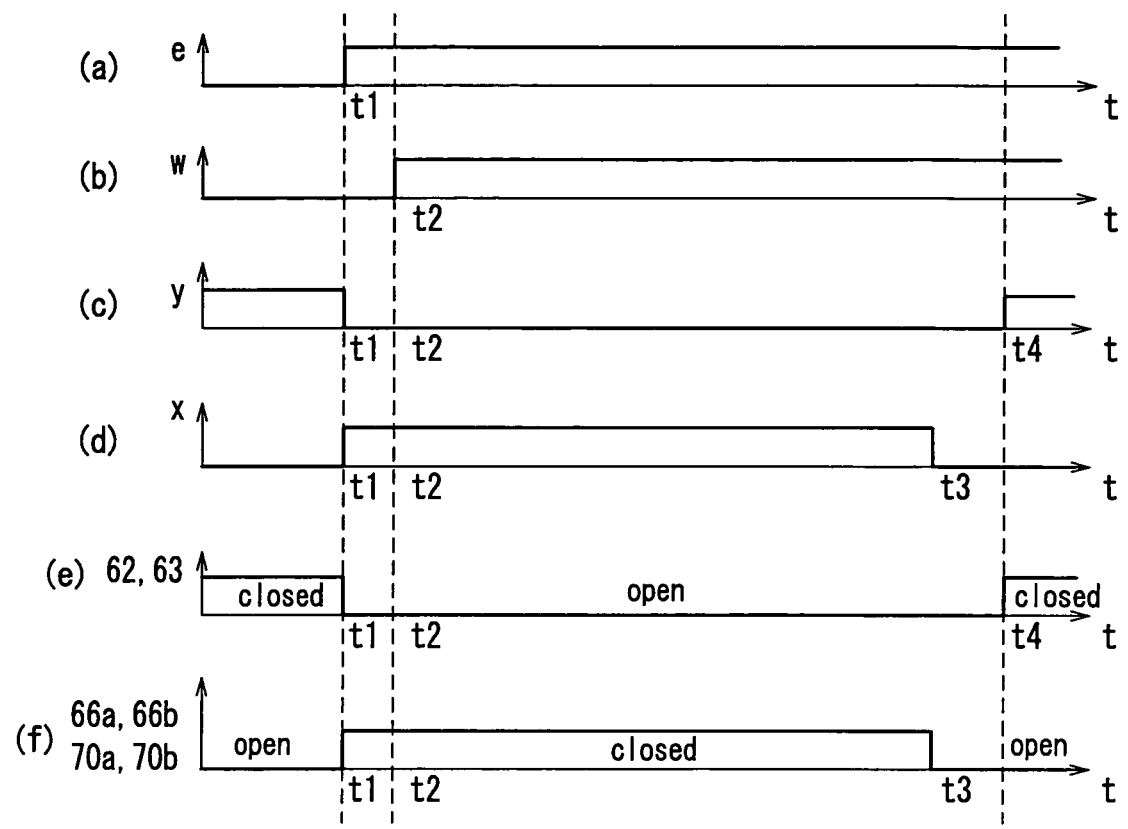
FIG. 12 is a waveform diagram showing a transient response of the radio communication receiver circuit in Embodiment 6.

In the waveform diagram of FIG. 12, (a) indicates a signal of the control circuit input line e, (b) indicates a signal of the gain control line w, (c) indicates a signal of the signal switch control line y, (d) indicates a signal of the high-pass filter switch control line x, (e) indicates the state of the fourth switches 62, 63, and (f) indicates the state of the third switches 66a, 66b, 70a, and 70b.

Figure 13:
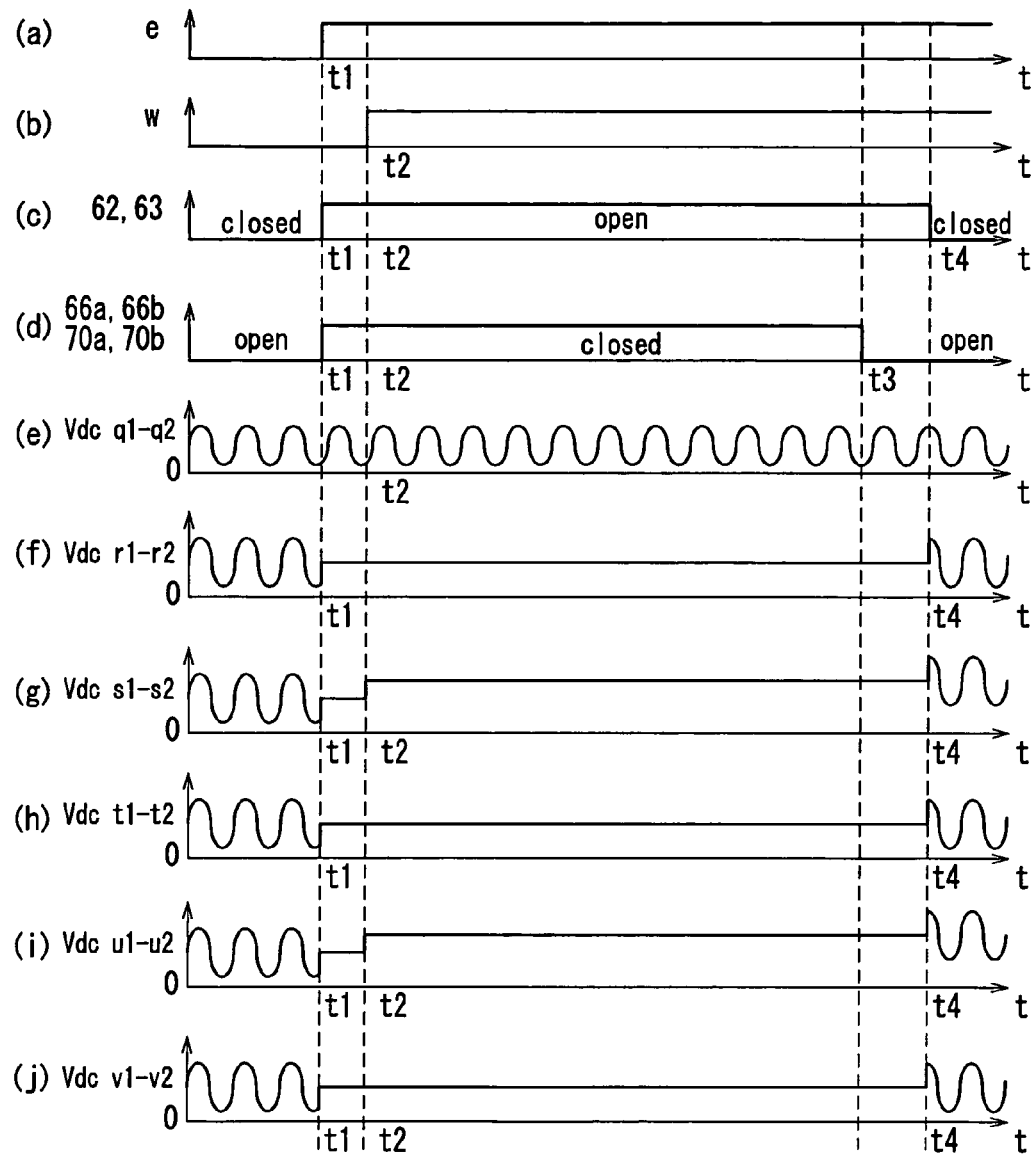
FIG. 13 is a waveform diagram showing a transient response of the radio communication receiver circuit in Embodiment 6.

In the waveform diagram of FIG. 13, (a) indicates a signal of the control circuit input line e, (b) indicates a pulse of the gain control line w, (c) indicates the state of the fourth switches 62, 63, (d) indicates the state of the third switches 66a, 66b, 70a, and 70b, (e) indicates a transient response in the output (q1-q2) of the first fixed gain amplifier 61, (f) indicates a transient response in the output (r1-r2) of the fourth switches 62, 63, (g) indicates a transient response in the output (s1-s2) of the gain control amplifier 65, (h) indicates a transient response in the output (t1-t2) of the high-pass filter 66, (i) indicates a transient response in the output (u1-u2) of the gain control amplifier 69, and (j) indicates a transient response in the output (v1-v2) of the high-pass filter 70 connected to the final output.

The control of switching the gains will be described by referring to FIG. 12. When a gain-change pulse is input from the control circuit input line e at time t1, the high-pass filter switch control line x is changed from Low to High, as shown in FIG. 12(d). Therefore, the third switches 66a, 66b, 70a, and 70b of the high-pass filters 66, 70 are turned ON. At the same time, the signal switch control line y is changed from High to Low. Therefore, the fourth switches 62, 63 are turned OFF.

At time t2, the gains of the gain control amplifiers 65, 69 are switched by the gain control line w. At time t3, the high-pass filter switch control line x is changed from High to Low, and the third switches 66a, 66b, 70a, and 70b of the high-pass filters 66, 70 are turned OFF.

At time t4, the signal switch control line y is changed from Low to High, and the fourth switches 62, 63 are turned ON.

A transient response involved in the above control will be described by referring to FIG. 13. First, the output (q1, q2) of the first fixed gain amplifier 61 will be described, as shown in FIG. 13(e). This node is independent of the gain switching control. Therefore, neither a change in signal level nor a transient response due to DC offset voltage fluctuations occurs between t1 and t4.

Next, the output (r1, r2) of the fourth switches 62, 63 will be described, as shown in FIG. 13(f). At t1, the fourth switches 62, 63 are turned OFF, and a signal is interrupted. Therefore, only a DC voltage is present in the output (r1, r2) of the fourth switches 62, 63 after t1, and this condition continues until t4. When the output (r1, r2) of the fourth switches 62, 63 is OFF at t1, a discharge path of the charge stored in the capacitors 64c, 64d of the high-pass filter 64 does not exist, so that the charge stored in the capacitors 64c, 64d is maintained between t1 and t4. Thus, when the fourth switches 62, 63 are turned ON at t4, the charge stored in the capacitors is not discharged. Consequently, a signal is output without causing a transient response due to DC voltage fluctuations in the output of the high-pass filter 64.

Next, the output (s1, s2) of the gain control amplifier 65 will be described, as shown in FIG. 13 (g). At t1, the fourth switches 62, 63 are turned OFF. Therefore, a signal is interrupted, and only a DC voltage is present in the output (s1, s2) of the gain control amplifier 65 after t1. Thus, a transient response due to DC voltage fluctuations does not occur at t1. At t2, the gain of the gain control amplifier 65 is changed to cause a step change in the DC offset voltage of the output (s1, s2). However, this change is small and not a problem. Since a signal still is interrupted by the fourth switches 62, 63, only a DC is present in the output (s1, s2) of the gain control amplifier 65 between t2 and t4. At t4, the fourth switches 62, 63 are turned ON, so that a signal is transmitted. Thus, a transient response due to DC voltage fluctuations resulting from the presence of a signal does not occur at both t1 and t4.

Next, the output (t1, t2) of the high-pass filter 66 will be described, as shown in FIG. 13 (h). At t1, the high-pass filter switch control line x is changed from Low to High, and the third switches 66a, 66b of the high-pass filter 66 are turned ON. Then, the output (t1, t2) of the high-pass filter 66 is fixed to a reference voltage of the high-pass filter. Therefore, only a DC is present in the output (t1, t2) of the high-pass filter 66 after t1. Thus, a transient response due to DC voltage fluctuations does not occur at t1. At t3, the high-pass filter switch control line x is changed from High to Low, and the third switches 66a, 66b of the high-pass filter 66 are turned OFF. However, a signal has been interrupted because the fourth switches are OFF. Accordingly, DC voltage fluctuations do not occur in the output (t1, t2) of the high-pass filter 66, causing no transient response. At t4, although a signal is transmitted by the switching operation of the fourth switches 62, 63 from OFF to ON, a transient response does not occur due to the DC offset voltage resulting from the presence of the signal in the output (t1, t2) of the high-pass filter 66.

Next, the output (u1, u2) of the gain control amplifier 69 will be described, as shown in FIG. 13(i). At t1, the fourth switches 62, 63 are turned OFF. Therefore, a signal is interrupted, and only a DC is present in the output (u1, u2) of the gain control amplifier 69 after t1. Thus, a transient response due to DC voltage fluctuations does not occur at t1. At t2, the gain of the gain control amplifier 69 is changed to cause a step change in the DC offset voltage of the output (u1, u2). However, this change is small and not a problem. Since a signal still is interrupted by the fourth switches 62, 63, only a DC voltage is present in the output (u1, u2) of the gain control amplifier 69 between t2 and t4. At t4, the fourth switches 62, 63 are turned ON, so that a signal is transmitted. Thus, a transient response due to DC voltage fluctuations resulting from the presence of a signal does not occur at both t1 and t4.

Finally, the output (v1, v2) of the high-pass filter 70, which is the final output of the circuit of FIG. 11, will be described, as shown in FIG. 13(j). At t1, the high-pass filter switch control line x is changed from Low to High, and the third switches 70a, 70b of the high-pass filter 70 are turned ON. Then, the output (v1, v2) of the high-pass filter 70 is fixed to a reference voltage of the high-pass filter. Therefore, only a DC is present in the output (v1, v2) of the high-pass filter 70 after t1. Thus, a transient response due to DC voltage fluctuations does not occur at t1. At t3, the high-pass filter switch control line x is changed from High to Low, and the third switches 70a, 70b of the high-pass filter 70 are turned OFF. However, a signal has been interrupted because the fourth switches 62, 63 are OFF. Accordingly, DC voltage fluctuations do not occur in the output (v1, v2) of the high-pass filter 70, causing no transient response. At t4, although a signal is transmitted by the switching operation of the fourth switches 62, 63 from OFF to ON, a transient response does not occur due to the DC offset voltage resulting from the presence of the signal in the output (v1, v2) of the high-pass filter 70.

As described above, when the gains are switches at t2, the third switches 66a, 66b, 70a, and 70b of the high-pass filters 66, 70 are ON, the outputs (t1, t2) (v1, v2) are fixed to the reference voltages of the high-pass filters, respectively. Therefore, a transient response due to DC voltage fluctuations does not occur in principle at the time of switching the gains. Thus, the period of time from t2 to t4 in FIGS. 12 and 13 can be much shorter than that from t2 to t3 in FIG. 5. Consequently, the configuration and control of the circuit of FIG. 11 can reduce the time of signal loss as compared to the circuit of FIG. 4.

Embodiment 6 of the present invention can increase the gain variable range of the circuit and suppress a transient response due to DC voltage fluctuations resulting from the presence of the final output, even if the gains are changed significantly during the reception of signals. Moreover, it is also possible to reduce the time of signal loss when the gains are switched.

Embodiment 7

A direct conversion receiver circuit of Embodiment 7 of the present invention will be described by referring to FIG. 14.

Figure 14:
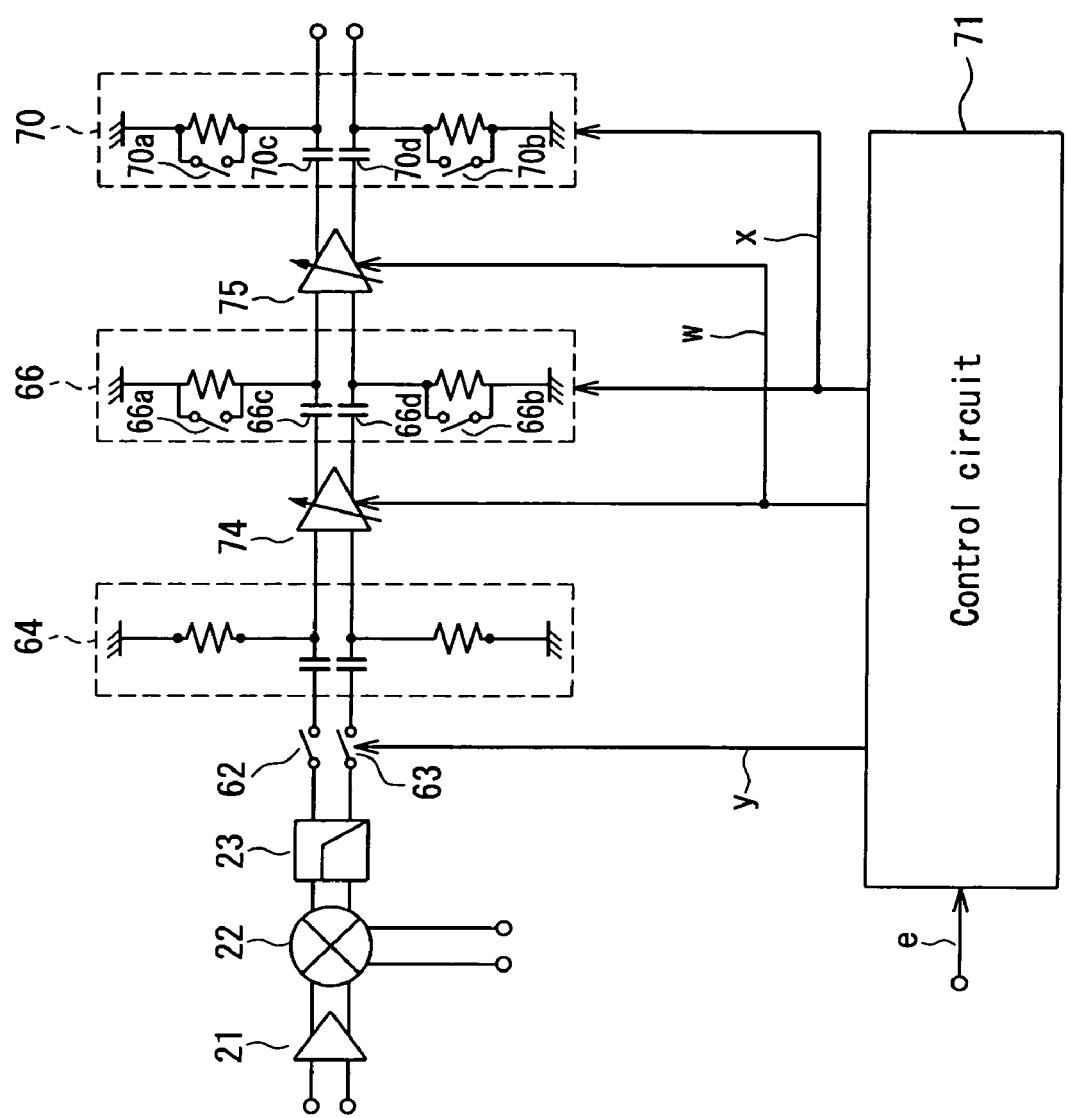
FIG. 14 is a circuit diagram showing the configuration of a radio communication receiver circuit in Embodiment 7 of the present invention.

FIG. 14 shows a baseband circuit that constitutes the receiver circuit of this embodiment. The baseband circuit is the same in configuration as the circuit of Embodiment 6 as shown in FIG. 11 except that the fixed gain amplifiers are removed. This circuit includes a LNA 21, a mixer 22, a low-pass filter 23, a plurality of high-pass filters 64, 66, and 70, a plurality of gain control amplifiers 74, 75, fourth switches 62, 63, and a control circuit 71. The gains of the gain control amplifiers 74, 75 are 0 dB or more. In FIG. 14, the elements having the same functions as those in FIG. 11 are denoted by the same reference numerals.

Like the circuit of FIG. 11, the control circuit 71 controls the third switches 66a, 66b, 70a, and 70b of the high-pass filters 66, 70 connected to the respective outputs of the gain control amplifiers 74, 75, the gains of the gain control amplifiers 74, 75, and the fourth switches 62, 63. Moreover, the control circuit 71 has the following functions. When a gain-change pulse is input, the control circuit 71 opens the fourth switches 62, 63, closes the third switches 66a, 66b, 70a, and 70b, and then switches the gains of the gain control amplifiers 74, 75. After a predetermined time has passed from the switching of the gains, the control circuit 71 opens the third switches 66a, 66b, 70a, and 70b, and subsequently closes the fourth switches 62, 63.

The circuit of FIG. 14 has the same configuration as the circuit of FIG. 11 except that the fixed gain amplifiers are removed, the number of high-pass filters is decreased, and the maximum gains of the gain control amplifiers 74, 75 are 0 dB or more. The method for controlling the third switches 66a, 66b, 70a, and 70b of the high-pass filters 66, 70 connected to the respective outputs of the gain control amplifiers 74, 75, the gains of the gain control amplifiers 74, 75, and the fourth switches 62, 63 also is the same.

Therefore, when a transient response at the time of switching the gains is compared between the circuit of FIG. 11 and the circuit of FIG. 14, since the maximum gains of the gain control amplifiers 74, 75 are 0 dB or more, DC offset voltage fluctuations are larger in the outputs of the gain control amplifiers 74, 75 in FIG. 14 than in the outputs of the gain control amplifiers 65, 69 in FIG. 11 at t2. However, a transient response in the final output in FIG. 14 is the same as that in the final output in FIG. 11, and there is no transient response due to DC offset fluctuations.

Moreover, compared to the circuit of FIG. 11, the circuit of FIG. 14 can remove the fixed gain amplifiers and decrease the number of high-pass filters, thereby reducing the circuit size.

As described above, Embodiment 7 of the present invention can reduce the circuit size, increase the gain variable range of the circuit, and suppress a transient response due to DC voltage fluctuations resulting from the presence of a signal in the final output, even if the gains are changed significantly during the reception of signals. Moreover, it is also possible to reduce the time of signal loss when the gains are switched.

Embodiment 8

A direct conversion receiver circuit of Embodiment 8 of the present invention will be described by referring to FIGS. 15, 16 and 17.

Figure 15:
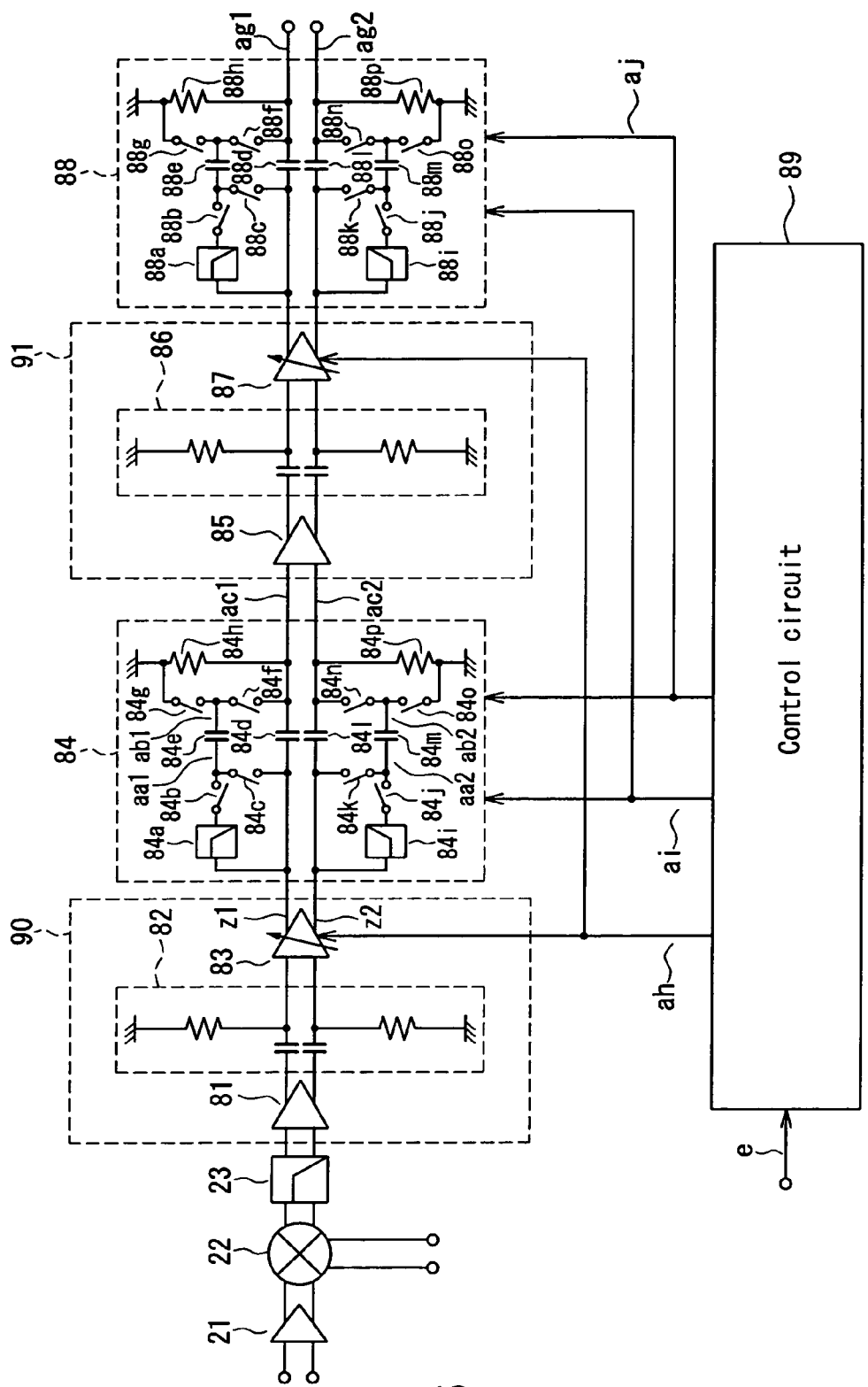
FIG. 15 is a circuit diagram showing the configuration of a radio communication receiver circuit in Embodiment 8 of the present invention.

FIG. 15 shows a baseband circuit that constitutes the receiver circuit of this embodiment. The baseband circuit includes a LNA 21, a mixer 22, and a low-pass filter 23, which may be the same as those used in the circuit of Embodiment 1 as shown in FIG. 1. After the low-pass filter 23, composite amplifiers 90, 91 including fixed gain amplifiers 81, 85, high-pass filters 82, 86, and gain control amplifiers 83, 87, respectively, are connected in multiple stages. The fixed gains amplifiers 81, 85, the high-pass filters 82, 86, and the gain control amplifiers 83, 87 also may be the same as those used in the circuit of FIG. 1. The gains of the fixed gain amplifiers 81, 85 are 0 dB or more. The maximum gains of the gain control amplifiers 83, 87 are 0 dB or less. Although the circuit of FIG. 15 uses two stages of the composite amplifiers 90, 91, two or more composite amplifiers may be connected in multiple stages.

High-pass filters 84, 88 are connected to the outputs of the gain control amplifiers 83, 87 of the composite amplifiers 90, 91 and include fifth switches 84$b$, 84$j$ and 88$b$, 88$j$, sixth switches 84$g$, 84$o$ and 88$g$, 88$o$, seventh switches 84$c$, 84$k$ and 88$c$, 88$k$, eighth switches 84$f$, 84$n$ and 88$f$, 88$n$, second capacitors 84$d$, 84$l$ and 88$d$, 88$l$, third capacitors 84$e$, 84$m$ and 88$e$, 88$m$, second resistors 84$h$, 84$p$ and 88$h$, 88$p$, and second low-pass filters 84$a$, 84$i$ and 88$a$, 88$i$, respectively.

Moreover, a control circuit 89 controls ON/OFF of the fifth switches 84$b$, 84$j$, 88$b$, and 88$j$, the sixth switches 84$g$, 84$o$, 88$g$, and 88$o$, the seventh switches 84$c$, 84$k$, 88$c$, and 88$k$, and the eighth switches 84$f$, 84$n$, 88$f$, and 88$n$ and the gains of the gain control amplifiers 83, 87.

The control circuit 89 has the following functions. When a gain-change pulse is input, the control circuit 89 closes the fifth switches 84$b$, 84$j$, 88$b$, and 88$j$ and the sixth switches 84$g$, 84$o$, 88$g$, and 88$o$ and opens the seventh switches 84$c$, 84$k$, 88$c$, and 88$k$ and the eighth switches 84$f$, 84$n$, 88$f$, and 88$n$, and then switches the gains of the gain control amplifiers 83, 87. After a predetermined time has passed from the switching of the gains, the control circuit 89 opens the fifth switches 84$b$, 84$j$, 88$b$, and 88$j$ and the sixth switches 84$g$, 84$o$, 88$g$, and 88$o$ and closes the seventh switches 84$c$, 84$k$, 88$c$, and 88$k$ and the eighth switches 84$f$, 84$n$, 88$f$, and 88$n$.

In the receiver circuit of Embodiment 2 as shown in FIG. 4, the DC offset voltage does not fluctuate in the final output (d1, d2), even if the gains are changed significantly during the reception of signals. At the time of switching the gains, however, the first switches 32, 33 are OFF and the second switches 34, 35 are ON for a predetermined period of time, which is equal to or longer than the time constants of the high-pass filters 27, 29, and 31. Consequently, no signal is transmitted to the final output, and a signal is lost for a long time.

Therefore, by performing the above control with the circuit configuration as shown in FIG. 15, this embodiment can increase the gain variable range of the circuit and suppress a transient response due to DC voltage fluctuations resulting from the presence of a signal in the final output, even if the gains are changed significantly during the reception of signals. Moreover, it is also possible to reduce the time of signal loss when the gains are switched.

A method for controlling the gain control amplifiers 83, 87 and the fifth switches 84$b$, 84$j$, 88$b$, and 88$j$, the sixth switches 84$g$, 84$o$, 88$g$, and 88$o$, the seventh switches 84$c$, 84$k$, 88$c$, and 88$k$, and the eighth switches 84$f$, 84$n$, 88$f$, and 88$n$ of the high-pass filters 84, 88 by the control circuit 89 at the time of switching the gains while signals are input to the circuit of FIG. 15, and transient responses in each node will be described by referring to FIGS. 16 and 17.

In FIG. 15, the two-phase output of the gain control amplifier 83 consists of a positive output z1 and a negative output z2. In the high-pass filter 84, aa1 represents a node of the third capacitor 84$e$ that is on the same side as the fifth switch 84$b$, aa2 represents a node of the third capacitor 84$m$ that is on the same side as the fifth switch 84$j$, ab1 represents a node of the third capacitor 84$e$ that is on the same side as the sixth switch 84$g$, and ab2 represents a node of the third capacitor 84$m$ that is on the same side as the sixth switch 84$o$. The two-phase output of the high-pass filter 84 consists of a positive output ac1 and a negative output ac2. The two-phase output of the high-pass filter 88 connected to the final output consists of a positive output ag1 and a negative output ag2.

A control circuit input line e is input to the control circuit 89. A first high-pass filter switch control line ai controls the fifth switches 84$b$, 84$j$, 88$b$, and 88$j$ and the sixth switches 84$g$, 84$o$, 88$g$, and 88$o$ of the high-pass filters 84, 88. A second high-pass filter switch control line aj controls the seventh switches 84$c$, 84$k$, 88$c$, and 88$k$ and the eighth switches 84$f$, 84$n$, 88$f$, and 88$n$ of the high-pass filters 84, 88. A gain control line ah controls the gain control amplifiers 83, 87.

The fifth switches 84$b$, 84$j$, 88$b$, and 88$j$ and the sixth switches 84$g$, 84$o$, 88$g$, and 88$o$ are turned ON or OFF depending on whether the first high-pass filter switch control line ai is High or Low.

The seventh switches 84$c$, 84$k$, 88$c$, and 88$k$ and the eighth switches 84$f$, 84$n$, 88$f$, and 88$n$ are turned ON or OFF depending on whether the second high-pass filter switch control line aj is High or Low.

Figure 16:
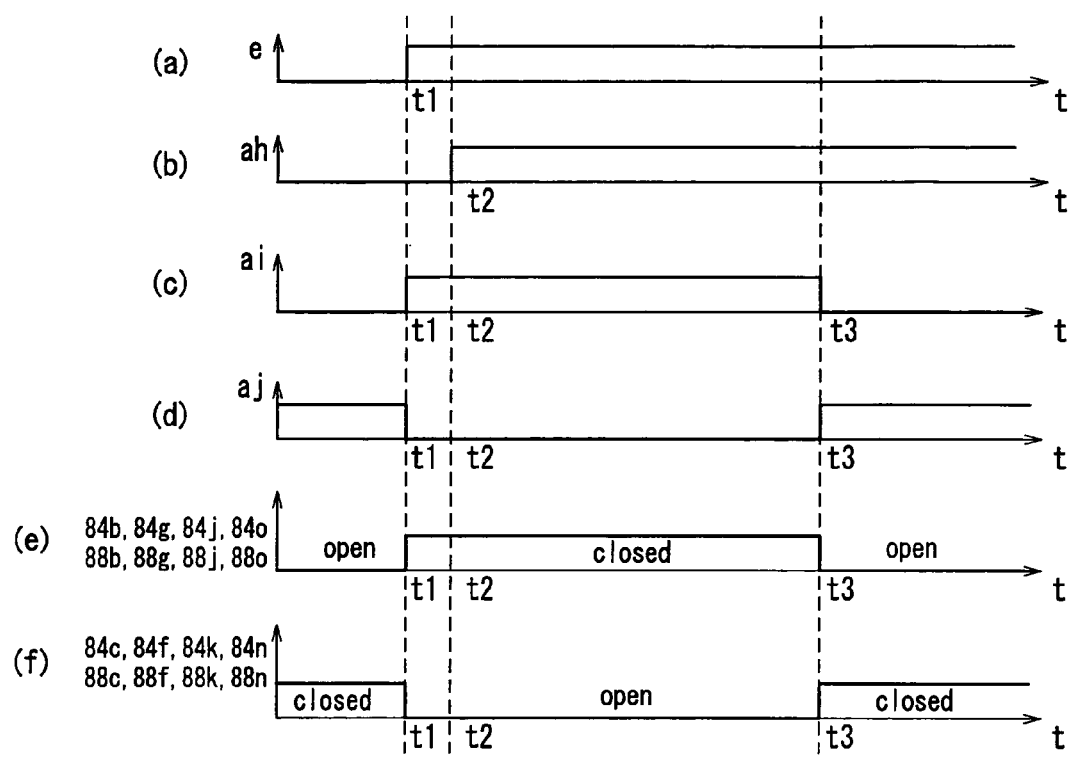
FIG. 16 is a waveform diagram showing a transient response of the radio communication receiver circuit in Embodiment 8.

In the waveform diagram of FIG. 16, ($a$) indicates a signal of the control circuit input line e, ($b$) indicates a signal of the gain control line ah, ($c$) indicates a signal of the first high-pass filter switch control line ai, ($d$) indicates a signal of the second high-pass filter switch control line aj, ($e$) indicates the state of the fifth and sixth switches 84$b$, 84$j$, 88$b$, 88$j$, 84$g$, 84$o$, 88$g$, and 88$o$, and ($f$) indicates the state of the seventh and eighth switches 84$c$, 84$k$, 88$c$, 88$k$, 84$f$, 84$n$, 88$f$, and 88$n$.

Figure 17:
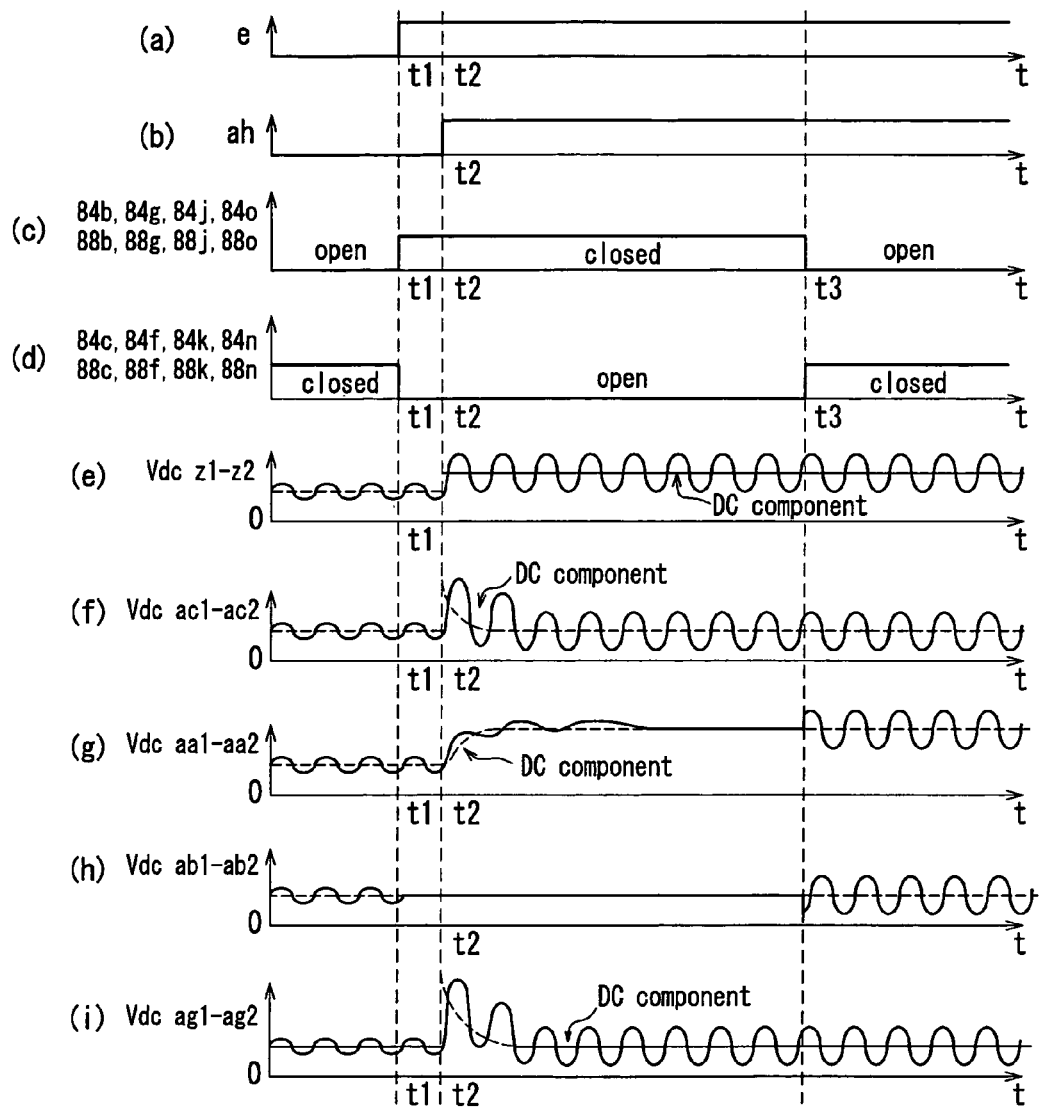
FIG. 17 is a waveform diagram showing a transient response of the radio communication receiver circuit in Embodiment 8.

In the waveform diagram of FIG. 17, ($a$) indicates a signal of the control circuit input line e, ($b$) indicates a signal of the gain control line ah, ($c$) indicates the state of the fifth and sixth switches 84$b$, 84$j$, 88$b$, 88$j$, 84$g$, 84$o$, 88$g$, and 88$o$, ($d$) indicates the state of the seventh and eighth switches 84$c$, 84$k$, 88$c$, 88$k$, 84$f$, 84$n$, 88$f$, and 88$n$, ($e$) indicates a transient response in the output (z1-z2) of the gain control amplifier 83, ($f$) indicates a transient response in the output (ac1-ac2) of the high-pass filter 84, ($g$) indicates a transient response in a difference (aa1-aa2) between the node aa1 on the side of the fifth switch 84b and the node aa2 on the side of the fifth switch 84j, (h) indicates a transient response in a difference (ab1-ab2) between the node ab1 on the side of the sixth switch 84g and the node ab2 on the side of the sixth switch 84o, and (i) indicates a transient response in the output (ag1-ag2) of the high-pass filter 88 connected to the final output.

The control of switching the gains will be described by referring to FIG. 16. When a gain-change pulse is input from the control circuit input line e at time t1, the first high-pass filter switch control line ai is changed from Low to High. Therefore, the fifth switches 84b, 84j, 88b, and 88j and the sixth switches 84g, 84o, 88g, and 88o of the high-pass filters 84, 88 are turned ON. At the same time, the second high-pass filter switch control line aj is changed from High to Low. Therefore, the seventh switches 84c, 84k, 88c, and 88k and the eighth switches 84f, 84n, 88f, and 88n of the high-pass filters 84, 88 are turned OFF.

At time t2, the gains of the gain control amplifiers 83, 87 are switched by the gain control line ah. At time t3, the first high-pass filter switch control line ai is changed from High to Low, and the fifth switches 84b, 84j, 88b, and 88j and the sixth switches 84g, 84o, 88g, and 88o of the high-pass filters 84, 88 are turned OFF. At the same time, the second high-pass filter switch control line aj is changed from Low to High, the seventh switches 84c, 84k, 88c, and 88k and the eighth switches 84f, 84n, 88f, and 88n of the high-pass filters 84, 88 are turned ON.

A transient response involved in the above control will be described by referring to FIG. 17. First, the output (z1, z2) of the gain control amplifier 83 will be described, as shown in FIG. 17(e). At t2, the gains are changed, and thus the signal amplitude and the DC offset voltage fluctuate in the output of the gain control amplifier 83. However, the amount of change in the DC offset voltage is small and not a problem. A transient response does not occur after t2.

Next, the output (ac1, ac2) of the high-pass filter 84 will be described, as shown in FIG. 17(i). At t1, the seventh switches 84c, 84k and the eighth switches 84f, 84n of the high-pass filter 84 are turned OFF. Therefore, the value of capacitance connected between the input and output of the high-pass filter 84 is changed from the sum of the second capacitors 84d, 84l and the third capacitors 84e, 84m to the second capacitors 84d, 84l alone. Thus, the time constant of the high-pass filter 84 is reduced after t1.

When the DC offset voltage fluctuates in the output of the gain control amplifier 83, i.e., the input of the high-pass filter 84 as a result of switching the gains at t2, a transient response due to DC offset voltage fluctuations occurs in the output (ac1, ac2) of the high-pass filter 84 at t2. However, since the time constant of the high-pass filter 84 is small, the convergence time of the transient response becomes shorter. In this case, a signal with a frequency higher than the low cutoff frequency of the high-pass filter formed of the second capacitors 84d, 84l and the second resistors 84h, 84p is transmitted. Therefore, if the second capacitors 84d, 84l are set to an appropriate value, the high-pass filter 84 can transmit a signal at the time of switching the gains while the convergence time is short enough not to be a problem.

At t1, the fifth switches 84b, 84j and the sixth switches 84g, 84o of the high-pass filter 84 are turned ON. Therefore, the nodes ab1, ab2 of the third capacitors 84e, 84m are connected to a reference voltage of the high-pass filter (FIG. 17(h)), and the nodes aa1, aa2 of the third capacitors 84e, 84m are connected to the output (z1, z2) of the gain control amplifier 83, i.e., the input of the high-pass filter 84 via the second low-pass filters 84a, 84i.

Accordingly, the DC component of the output (z1, z2) of the gain control amplifier 83 is extracted by the second low-pass filters 84a, 84i and then transmitted to the nodes aa1, aa2 of the third capacitors 84e, 84m after t1 (FIG. 17(g)). The time it takes for the DC component extracted by the second low-pass filters 84a, 84i to be stable at the nodes aa1, aa2 of the third capacitors 84e, 84m is determined by the time constants of the second low-pass filters 84a, 84i.

The nodes ab1, ab2 of the third capacitors 84e, 84m have been connected to the reference voltage of the high-pass filter from t1. Therefore, after the DC component is stabilized at the nodes aa1, aa2 of the third capacitors 84e, 84m, the charge that corresponds to a difference between the reference voltage of the high-pass filter 84 and the output DC voltage of the gain control amplifier 83 is stored in the third capacitors 84e, 84m.

At t3, the fifth switches 84b, 84j and the sixth switches 84g, 84o are turned OFF, and the seventh switches 84c, 84k and the eighth switches 84f, 84n are turned ON.

The times t2 and t3 are selected so that the period of time from t2 to t3 is longer than the time required for stabilization of the DC component extracted by the second low-pass filters 84a, 84j at the nodes aa1, aa2 of the third capacitors 84e, 84m. In this case, the charge corresponding to a difference between the reference voltage of the high-pass filter 84 and the output DC voltage of the gain control amplifier 83 is stored in the third capacitors 84e, 84m. The amount of the charge is equal to that stored in the third capacitors 84e, 84m in its steady state after the gains are changed.

Thus, when the fifth switches 84b, 84j and the sixth switches 84g, 84o are turned OFF, and the seventh switches 84c, 84k and the eighth switches 84f, 84n are turned ON at t3, the charge stored in the third capacitors 84e, 84m is not discharged. Consequently, a transient response due to DC offset voltage fluctuations does not occur in the output (ac1, ac2) of the high-pass filter 84 at t3.

As described above, although a transient response due to DC offset voltage fluctuations occurs in the output (ac1, ac2) of the high-pass filter 84 when the gains are changed at t2, the transient response will not be a problem. Moreover, there is no transient response at t3.

Next, the output (ag1, ag2) of the high-pass filter 88 connected to the final output will be described, as shown in FIG. 17(i). Because of the circuit configuration of the high-pass filter 88, a transient response in the output (ag1, ag2) is basically the same as that in the output (ac1, ac2) of the high-pass filter 84. Although a transient response occurs in the output (ag1, ag2) of the high-pass filter 88 at t2, it is small enough not to be a problem. Moreover, there is no transient response at t3.

Embodiment 8 of the present invention can increase the gain variable range of the circuit and suppress a transient response due to DC voltage fluctuations in the final output, even if the gains are changed significantly during the reception of signals. Moreover, it is also possible to reduce the time of signal loss when the gains are switched.

Embodiment 9

A direct conversion receiver circuit of Embodiment 9 of the present invention will be described by referring to FIG. 18.

Figure 18:
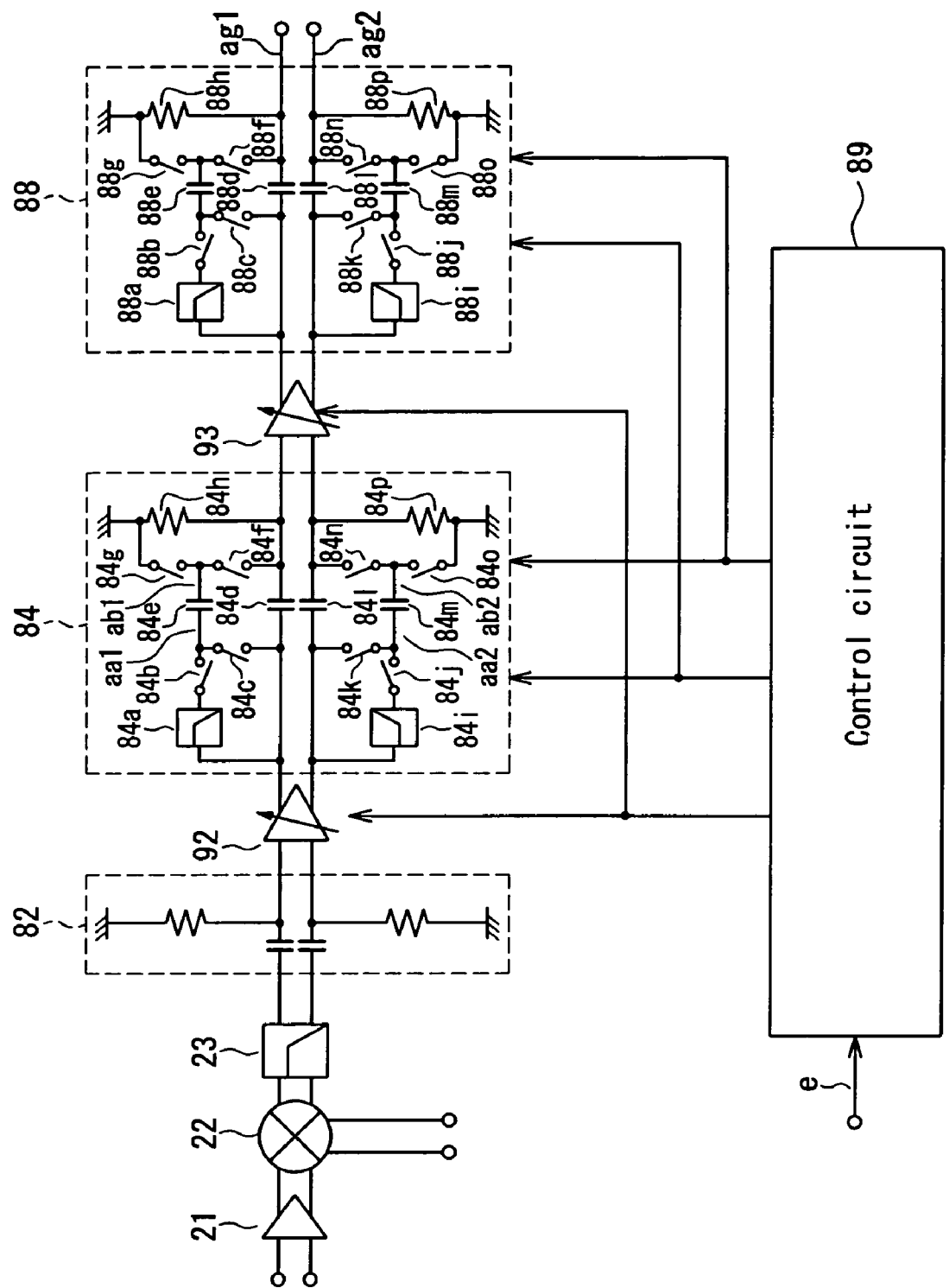
FIG. 18 is a circuit diagram showing the configuration of a radio communication receiver circuit in Embodiment 9 of the present invention.

FIG. 18 shows a baseband circuit that constitutes the receiver circuit of this embodiment. The baseband circuit is the same in configuration as the circuit of Embodiment 9 as shown in FIG. 15 except that the fixed gain amplifiers are removed. This circuit includes a LNA 21, a mixer 22, a low-pass filter 23, a plurality of high-pass filters 82, 84, and 88, a plurality of gain control amplifiers 92, 93, and a control circuit 89. The gains of the gain control amplifiers 92, 93 are 0 dB or more. In FIG. 18, the elements having the same functions as those in FIG. 15 are denoted by the same reference numerals.

Like the circuit of FIG. 15, the control circuit 89 has the following functions. When a gain-change pulse is input, the control circuit 89 closes the fifth switches 84b, 84j, 88b, and 88j and the sixth switches 84g, 84o, 88g, and 88o and opens the seventh switches 84c, 84k, 88c, and 88k and the eighth switches 84f, 84n, 88f, and 88n, and then switches the gains of the gain control amplifiers 92, 93. After a predetermined time has passed from the switching of the gains, the control circuit 89 opens the fifth switches 84b, 84j, 88b, and 88j and the sixth switches 84g, 84o, 88g, and 88o and closes the seventh switches 84c, 84k, 88c, and 88k and the eighth switches 84f, 84n, 88f, and 88n.

The circuit of FIG. 18 has the same configuration as the circuit of FIG. 15 except that the fixed gain amplifiers are removed, the number of high-pass filters is decreased, and the maximum gains of the gain control amplifiers 92, 93 are 0 dB or more. The method for controlling the fifth switches 84b, 84j, 88b, and 88j, the sixth switches 84g, 84o, 88g, and 88o, the seventh switches 84c, 84k, 88c, and 88k, and the eighth switches 84f, 84n, 88f, and 88n of the high-pass filters 84, 88 connected to the respective outputs of the gain control amplifiers 92, 93 also is the same.

Therefore, when a transient response at the time of switching the gains is compared between the circuit of FIG. 15 and the circuit of FIG. 18, since the maximum gains of the gain control amplifiers 92, 93 are 0 dB or more, DC offset voltage fluctuations are larger in the outputs of the gain control amplifiers 92, 93 in FIG. 18 than in the outputs of the gain control amplifiers 83, 87 in FIG. 15 at t2. Consequently, a transient response in the final output in FIG. 18 becomes larger than that in the final output in FIG. 15. However, the transient response can be reduced to such an extent that it is not a problem by selecting optimum values of the constants of the second capacitors 84d, 84l, 88d, and 88l and the third capacitors 84e, 84m, 88e, and 88m of the high-pass filters 84, 88.

Moreover, compared to the circuit of FIG. 15, the circuit of FIG. 18 can remove the fixed gain amplifiers and decrease the number of high-pass filters, thereby reducing the circuit size.

As described above, Embodiment 9 of the present invention can reduce the circuit size, increase the gain variable range of the circuit, and suppress a transient response due to DC voltage fluctuations in the final output, even if the gains are changed significantly during the reception of signals. Moreover, it is also possible to reduce the time of signal loss when the gains are switched.

Embodiment 10

A direct conversion receiver circuit of Embodiment 10 of the present invention will be described by referring to FIG. 19.

Figure 19:
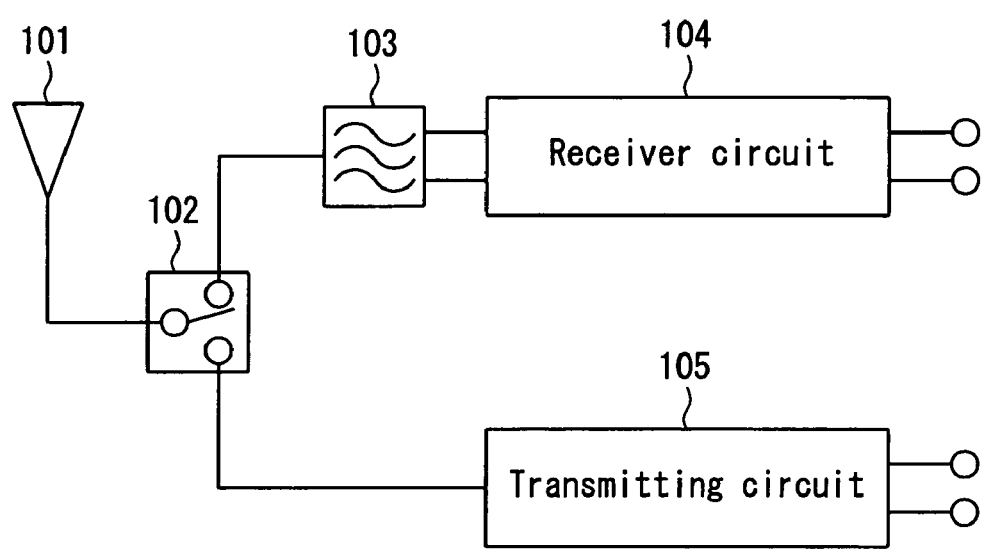
FIG. 19 is a block diagram showing the configuration of a radio communication receiver circuit in Embodiment 10 of the present invention.
Figure 20:
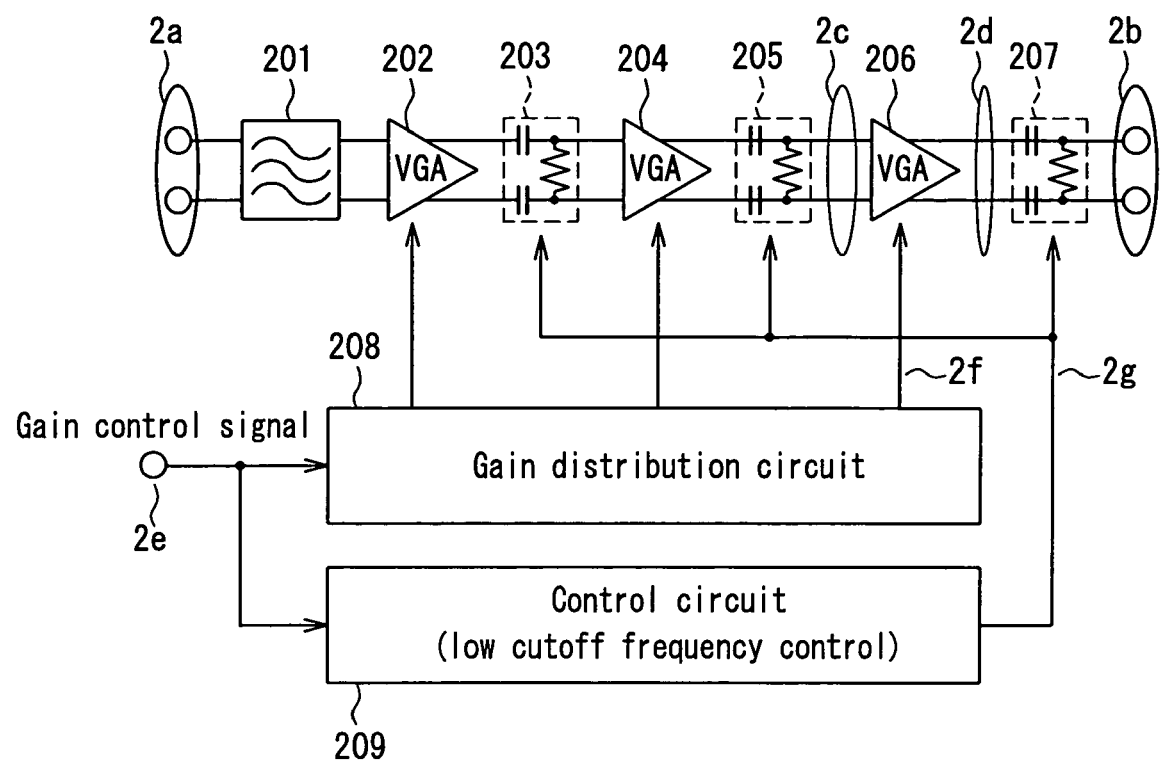
FIG. 20 is a circuit diagram showing the configuration of a conventional ratio communication receiver circuit.
Figure 21:
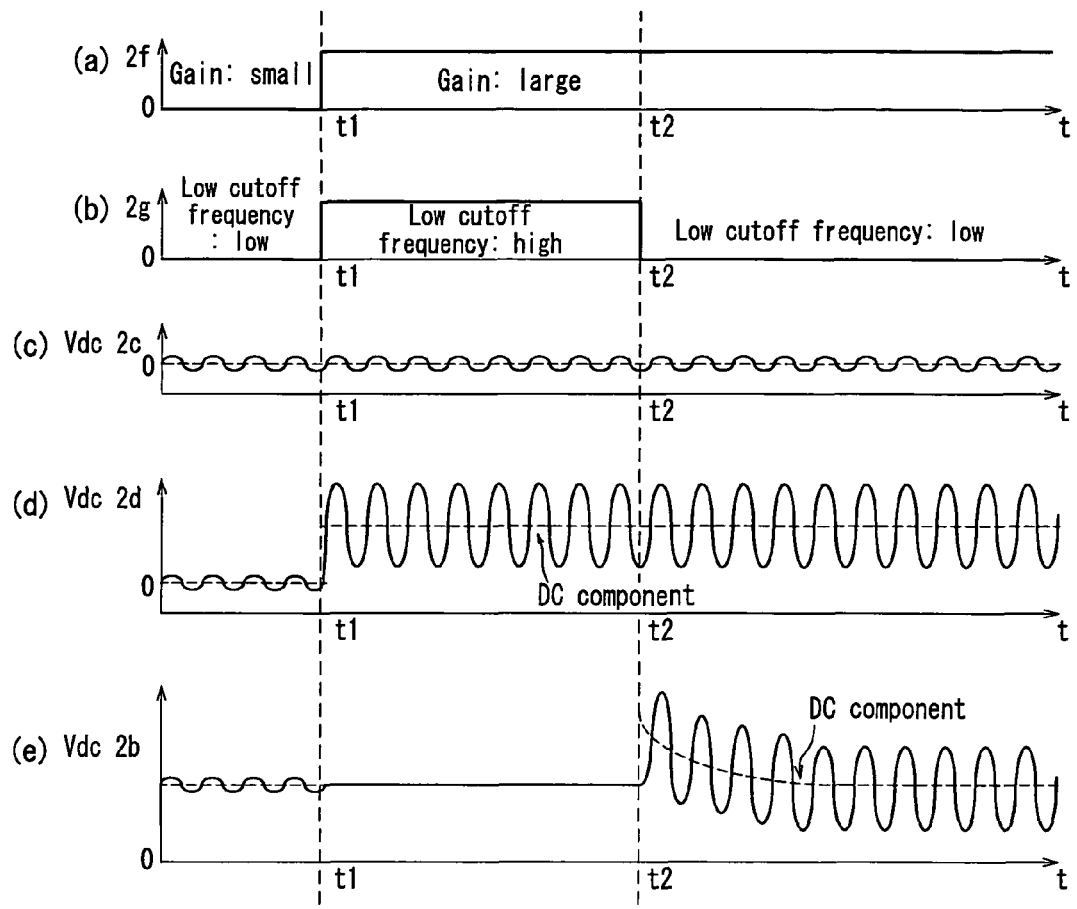
FIG. 21 is a waveform diagram showing a transient response when a gain is switched in the conventional radio communication receiver circuit.

FIG. 19 shows a baseband circuit that constitutes the receiver circuit of this embodiment. This circuit can be used, e.g., as a circuit of a portable telephone and includes an antenna 101, an antenna duplexer 102, a band-pass filter 103, and a receiver circuit 104 with the configuration of any one of Embodiments 1 to 9, and a transmitting circuit 105. The antenna 101 is connected to a stationary terminal portion of the antenna duplexer 102. One switching terminal of the antenna duplexer 102 is connected to the input side of the band-pass filter 103, and the output of the band-pass filter 103 is connected to the input side of the receiver circuit 104. The other switching terminal of the antenna duplexer 102 is connected to the output side of the transmitting circuit 105.

The LNA included in the receiver circuit 104 may be moved to the place between the band-pass filter 103 and the antenna duplexer 102.

This configuration can suppress a transient response, even if the gains are changed significantly during the reception of signals, thereby maintaining the quality of a received signal.

As described above, Embodiment 10 of the present invention can provide a portable telephone that can suppress degradation of the reception quality, even if the gains are changed significantly while signals are received.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A receiver circuit comprising:
   a low noise amplifier (LNA) to which a received signal is input;
   a mixer for mixing an output of the LNA and a local signal;
   a first low-pass filter for receiving an output of the mixer; and
   a composite amplifier in which a fixed gain amplifier, a high-pass filter, and a gain control amplifier are connected in the indicated order from an input side,
   wherein the fixed gain amplifier receives an output of the first low-pass filter,
   a gain of the fixed gain amplifier is 0 dB or more, and
   a maximum value of a gain control range of the gain control amplifier is 0 dB or less.

2. The receiver circuit according to claim 1, further comprising:
   at least one stage of a composite amplifier arranged in a subsequent stage of the composite amplifier;
   an interstage high-pass filter connected between the composite amplifiers;
   an output high-pass filter connected to an output of the gain control amplifier of the composite amplifier in the last stage;
   first switches inserted between an output of the output high-pass filter and output terminals of the receiver circuit;
   second switches inserted between an output side of the first switches and ground potentials; and
   a control circuit for controlling the first switches, the second switches, and gains of all the gain control amplifiers,
   wherein the control circuit has the following functions: when a gain-change pulse is input, the control circuit opens the first switches and closes the second switches, and then switches the gains of all the gain control amplifiers; after a predetermined time has passed from the switching of the gains, the control circuit closes the first switches and opens the second switches.

3. A receiver circuit comprising:
   a LNA to which a received signal is input;
   a mixer for mixing an output of the LNA and a local signal;
   a first low-pass filter for receiving an output of the mixer;
   multistage second composite amplifiers arranged in a subsequent stage of the first low-pass filter, each of the second composite amplifiers comprising a high-pass filter and a gain control amplifier that are connected in the indicated order;

an output high-pass filter connected to an output of the gain control amplifier of the second composite amplifier in the last stage;
first switches inserted between an output of the output high-pass filter and output terminals of the receiver circuit;
second switches inserted between an output side of the first switches and ground potentials; and
a control circuit for controlling the first switches, the second switches, and gains of all the gain control amplifiers,
wherein the gains of the gain control amplifiers are 0 dB or more, and
the control circuit has the following functions: when a gain-change pulse is input, the control circuit opens the first switches and closes the second switches, and then switches the gains of all the gain control amplifiers; after a predetermined time has passed from the switching of the gains, the control circuit closes the first switches and opens the second switches.

4. The receiver circuit according to claim 1, further comprising:
at least one stage of a composite amplifier arranged in a subsequent stage of the composite amplifier;
an input high-pass fitter inserted between the first low-pass filter and the first fixed gain amplifier of the composite amplifier in the first stage;
a high-pass filter provided with switches that is inserted on an output side of the gain control amplifier of the composite amplifier in each stage, the high-pass filter comprising first resistors, first capacitors, and third switches connected parallel to the first resistors;
a dummy amplifier that is connected to an output side of the first fixed gain amplifier, has the same configuration as the first fixed gain amplifier, and receives a voltage equal to an input DC voltage of the first fixed gain amplifier; and
a control circuit for controlling the first fixed gain amplifier, the dummy amplifier, the third switches, and gains of all the gain control amplifiers,
wherein the control circuit has the following functions: when a gain-change pulse is input, the control circuit puts the first fixed gain amplifier into a sleep state and the dummy amplifier into an active state, closes the third switches, and then switches the gains of all the gain control amplifiers; after a predetermined time has passed from the switching of the gains, the control circuit opens the third switches, and subsequently puts the first fixed gain amplifier into the active state and the dummy amplifier into the sleep state.

5. A receiver circuit comprising:
a LNA to which a received signal is input;
a mixer for mixing an output of the LNA and a local signal;
a first low-pass filter for receiving an output of the mixer;
a first high-pass filter for receiving an output of the first low-pass filter;
a fixed gain amplifier for receiving an output of the first high-pass filter;
a second high-pass filter for receiving an output of the fixed gain amplifier;
a dummy amplifier that is connected to an output side of the fixed gain amplifier, has the same configuration as the fixed gain amplifier, and receives a voltage equal to an input DC voltage of the fixed gain amplifier;
multistage gain control amplifiers arranged in a subsequent stage of the second high-pass filter;
a high-pass filter provided with switches that is inserted on an output side of the gain control amplifier in each stage, the high-pass filter comprising first resistors, first capacitors, and third switches connected parallel to the first resistors; and
a control circuit for controlling the fixed gain amplifier, the dummy amplifier, the third switches, and gains of all the gain control amplifiers,
wherein the gains of the gain control amplifiers are 0 dB or more, and
the control circuit has the following functions: when a gain-change pulse is input, the control circuit puts the fixed gain amplifier into a sleep state and the dummy amplifier into an active state, closes the third switches, and then switches the gains of all the gain control amplifiers; after a predetermined time has passed from the switching of the gains, the control circuit opens the third switches, and subsequently puts the fixed gain amplifier into the active state and the dummy amplifier into the sleep state.

6. The receiver circuit according to claim 1, further comprising:
at least one stage of a composite amplifier arranged in a subsequent stage of the composite amplifier;
a high-pass filter provided with switches that is inserted on an output side of the gain control amplifier of the composite amplifier in each stage, the high-pass filter comprising first resistors, first capacitors, and third switches connected parallel to the first resistors;
fourth switches inserted on an output side of the fixed gain amplifier of the composite amplifier in the first stage; and
a control circuit for controlling the fourth switches, the third switches, and gains of all the gain control amplifiers,
wherein the control circuit has the following functions: when a gain-change pulse is input, the control circuit opens the fourth switches, closes the third switches, and then switches the gains of all the gain control amplifiers; after a predetermined time has passed from the switching of the gains, the control circuit opens the third switches, and subsequently closes the fourth switches.

7. A receiver circuit comprising:
a LNA to which a received signal is input;
a mixer for mixing an output of the LNA and a local signal;
a first low-pass filter for receiving an output of the mixer;
a high-pass filter for receiving an output of the first low-pass filter;
multistage gain control amplifiers arranged in a subsequent stage of the high-pass filter;
a high-pass filter provided with switches that is inserted on an output side of the gain control amplifier in each stage, the high-pass filter comprising first resistors, first capacitors, and third switches connected parallel to the first resistors;
fourth switches inserted between the first low-pass filter and the high-pass filter; and
a control circuit for controlling the fourth switches, the third switches, and gains of all the gain control amplifiers,
wherein the gains of the gain control amplifiers are 0 dB or more; and
the control circuit has the following functions: when a gain-change pulse is input, the control circuit opens the fourth switches, closes the third switches, and then switches the gains of all the gain control amplifiers; after a predetermined time has passed from the switching of the gains, the control circuit opens the third switches, and subsequently closes the fourth switches.

8. The receiver circuit according to claim 1, further comprising:
- at least one stage of a composite amplifier arranged in a subsequent stage of the composite amplifier;
- a composite high-pass filter inserted on an output side of the gain control amplifier of the composite amplifier in each stage; and
- a control circuit for controlling the composite high-pass filters and gains of the gain control amplifiers,
- wherein each of the composite high-pass filters comprises:
  - second capacitors inserted on the output side of the gain control amplifier;
- second resistors connected between output terminals of the second capacitors and ground potentials;
- second low-pass filters, fifth switches, third capacitors, and sixth switches connected in series between input terminals of the second capacitors and terminals of the second resistors that are located on the same side as the ground potentials;
- seventh switches inserted between input terminals of the third capacitors and input terminals of the second capacitors; and
- eighth switches inserted between output terminals of the third capacitors and output terminals of the second capacitors, and
- the control circuit has the following functions: when a gain-change pulse is input, the control circuit closes the fifth switches and the sixth switches and opens the seventh switches and the eighth switches, and then switches the gains of the gain control amplifiers; after a predetermined time has passed from the switching of the gains, the control circuit opens the fifth switches and the sixth switches and closes the seventh switches and the eighth switches.

9. A receiver circuit comprising:
- a LNA to which a received signal is input;
- a mixer for mixing an output of the LNA and a local signal;
- a first low-pass filter for receiving an output of the mixer;
- a high-pass filter for receiving an output of the first low-pass filter;
- multistage gain control amplifiers arranged in a subsequent stage of the high-pass filter;
- a composite high-pass filter inserted on an output side of the gain control amplifier in each stage; and
- a control circuit for controlling the composite high-pass filters and gains of the gain control amplifiers,
- wherein each of the composite high-pass filters comprises:
- second capacitors inserted on the output side of the gain control amplifier;
- second resistors connected between output terminals of the second capacitors and ground potentials;
- second low-pass filters, fifth switches, third capacitors, and sixth switches connected in series between input terminals of the second capacitors and terminals of the second resistors that are located on the same side as the ground potentials;
- seventh switches inserted between input terminals of the third capacitors and input terminals of the second capacitors; and
- eighth switches inserted between output terminals of the third capacitors and output terminals of the second capacitors,
- the gains of the gain control amplifiers are 0 dB or more, and
- the control circuit has the following functions: when a gain-change pulse is input, the control circuit closes the fifth switches and the sixth switches and opens the seventh switches and the eighth switches, and then switches the gains of the gain control amplifiers; after a predetermined time has passed from the switching of the gains, the control circuit opens the fifth switches and the sixth switches and closes the seventh switches and the eighth switches.

10. A portable telephone comprising:
- an antenna;
- an antenna duplexer comprising a stationary terminal portion and switching terminals;
- a band-pass filter;
- the receiver circuit according to claim 1, and
- a transmitting circuit,
- wherein the antenna is connected to the stationary terminal portion of the antenna duplexer, an input side of the band-pass filter is connected to one of the switching terminals of the antenna duplexer, an input side of the receiver circuit is connected to an output side of the band-pass filter, and an output side of the transmitting circuit is connected to the other switching terminal of the antenna duplexer.

11. A portable telephone comprising:
- an antenna;
- an antenna duplexer comprising a stationary terminal portion and switching terminals;
- a band-pass filter;
- the receiver circuit according to claim 3, and
- a transmitting circuit,
- wherein the antenna is connected to the stationary terminal portion of the antenna duplexer, an input side of the band-pass filter is connected to one of the switching terminals of the antenna duplexer, an input side of the receiver circuit is connected to an output side of the band-pass filter, and an output side of the transmitting circuit is connected to the other switching terminal of the antenna duplexer.

12. A portable telephone comprising:
- an antenna;
- an antenna duplexer comprising a stationary terminal portion and switching terminals;
- a band-pass filter;
- the receiver circuit according to claim 5, and
- a transmitting circuit,
- wherein the antenna is connected to the stationary terminal portion of the antenna duplexer, an input side of the hand-pass filter is connected to one of the switching terminals of the antenna duplexer, an input side of the receiver circuit is connected to an output side of the band-pass filter, and an output side of the transmitting circuit is connected to the other switching terminal of the antenna duplexer.

13. A portable telephone comprising:
- an antenna;
- an antenna duplexer comprising a stationary terminal portion and switching terminals;
- a band-pass filter;
- the receiver circuit according to claim 7, and
- a transmitting circuit,
- wherein the antenna is connected to the stationary terminal portion of the antenna duplexer, an input side of the band-pass filter is connected to one of the switching terminals of the antenna duplexer, an input side of the receiver circuit is connected to an output side of the band-pass filter, and an output side of the transmitting circuit is connected to the other switching terminal of the antenna duplexer.

14. A portable telephone comprising:
an antenna;
an antenna duplexer comprising a stationary terminal portion and switching terminals;
a band-pass filter;
the receiver circuit according to claim 9, and
a transmitting circuit,
wherein the antenna is connected to the stationary terminal portion of the antenna duplexer, an input side of the band-pass filter is connected to one of the switching terminals of the antenna duplexer, an input side of the receiver circuit is connected to an output side of the band-pass filter, and an output side of the transmitting circuit is connected to the other switching terminal of the antenna duplexer.

* * * * *